(12) United States Patent
Kim et al.

(10) Patent No.: US 11,715,713 B2
(45) Date of Patent: Aug. 1, 2023

(54) NONVOLATILE MEMORY DEVICE AND NONVOLATILE MEMORY SYSTEM INCLUDING THE SAME

(71) Applicant: Samsung Electronics Co., Ltd., Suwon-si (KR)

(72) Inventors: Ji Won Kim, Seoul (KR); Jae Ho Ahn, Seoul (KR); Sung-Min Hwang, Hwaseong-si (KR); Joon-Sung Lim, Seongnam-si (KR); Suk Kang Sung, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/405,637

(22) Filed: Aug. 18, 2021

(65) Prior Publication Data
US 2022/0115344 A1 Apr. 14, 2022

(30) Foreign Application Priority Data
Oct. 8, 2020 (KR) ........................ 10-2020-0129855

(51) Int. Cl.
| | |
|---|---|
| *H01L 25/065* | (2023.01) |
| *H01L 25/18* | (2023.01) |
| *H01L 23/00* | (2006.01) |
| *H01L 25/00* | (2006.01) |

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01);
(Continued)

(58) Field of Classification Search
CPC ..... H01L 24/08; H01L 25/0657; H01L 25/18; H01L 2224/08145; H01L 2924/1431; H01L 2924/14511; H01L 2224/08146; H01L 2224/32145; H01L 2224/48145; H01L 25/117
See application file for complete search history.

(56) References Cited

U.S. PATENT DOCUMENTS

| | | | |
|---|---|---|---|
| 8,158,515 B2 | 4/2012 | Farooq et al. | |
| 8,853,830 B2 | 10/2014 | Chang et al. | |
| 9,558,945 B2 | 1/2017 | Fukuzumi et al. | |

(Continued)

*Primary Examiner* — Thanh Y. Tran
(74) *Attorney, Agent, or Firm* — Harness, Dickey & Pierce, P.L.C.

(57) ABSTRACT

The nonvolatile memory device includes a substrate including a first surface and a second surface opposite to the first surface in a first direction; a common source line on the first surface of the substrate; a plurality of word lines stacked on the common source line; a first insulating pattern spaced apart from the plurality of word lines in a second direction crossing the first direction, and in the substrate; an insulating layer on the second surface of the substrate; a first contact plug penetrating the first insulating pattern and extending in the first direction; a second contact plug penetrating the insulating layer, extending in the first direction, and connected to the first contact plug; an upper bonding metal connected to the first contact plug and connected to a circuit element; and a first input/output pad connected to the second contact plug and electrically connected to the circuit element.

20 Claims, 23 Drawing Sheets

(52) U.S. Cl.
CPC ............... *H01L 2924/1431* (2013.01); *H01L 2924/14511* (2013.01)

(56) References Cited

U.S. PATENT DOCUMENTS

| | | |
|---|---|---|
| 10,199,326 B1 | 2/2019 | Ohsaki |
| 10,269,863 B2 | 4/2019 | Chen et al. |
| 10,354,987 B1 | 7/2019 | Mushiga et al. |
| 11,462,270 B2* | 10/2022 | Park ................. G11C 29/04 |
| 11,462,275 B2* | 10/2022 | Kim .................. H10B 43/40 |
| 2019/0296041 A1 | 9/2019 | Yamasaka et al. |
| 2022/0020433 A1* | 1/2022 | Seo .................... G11C 16/08 |
| 2022/0051727 A1* | 2/2022 | Gwak ............... G11C 16/349 |
| 2022/0157754 A1* | 5/2022 | Park .................. G11C 29/54 |

* cited by examiner

NONVOLATILE MEMORY DEVICE AND NONVOLATILE MEMORY SYSTEM INCLUDING THE SAME

CROSS-REFERENCE TO RELATED APPLICATION

This application claims priority from Korean Patent Application No. 10-2020-0129855 filed on Oct. 8, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to nonvolatile memory devices and nonvolatile memory systems including the same.

2. Description of the Related Art

Semiconductor memory devices can be broadly classified into volatile memory devices and nonvolatile memory devices. In order to satisfy consumer demands for superior performance and inexpensive prices, the integration density of nonvolatile memory devices is increasing. However, in the case of a two-dimensional or a planar memory device, the integration density is determined by the area occupied by a unit memory cell. Therefore, recently, a three-dimensional memory device in which unit memory cells are vertically arranged has been developed.

SUMMARY

Aspects of the present disclosure provide a nonvolatile memory device having improved reliability in a process of forming a contact plug.

Aspects of the present disclosure also provide a nonvolatile memory system having improved reliability in a process of forming a contact plug.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some example embodiments, there is provided a nonvolatile memory device including a substrate including a first surface and a second surface opposite to the first surface in a first direction; a common source line on the first surface of the substrate; a plurality of word lines stacked on the common source line; a first insulating pattern spaced apart from the plurality of word lines in a second direction crossing the first direction, and in the substrate; an insulating layer on the second surface of the substrate; a first contact plug penetrating the first insulating pattern and extending in the first direction; a second contact plug penetrating the insulating layer, extending in the first direction, and connected to the first contact plug; an upper bonding metal connected to the first contact plug and connected to a circuit element; and a first input/output pad connected to the second contact plug and electrically connected to the circuit element.

According to some example embodiments, there is provided a nonvolatile memory device including a peripheral circuit region including a plurality of circuit elements and including a lower bonding metal connected to the plurality of circuit elements; and a cell region electrically connected to the plurality of circuit elements and including a memory element for storing data, and including an upper bonding metal connected to the memory element, wherein the peripheral circuit region includes a substrate including a first surface and a second surface opposite to the first surface in a first direction; a plurality of circuit elements on the first surface of the first substrate; a metal layer on the first surface of the first substrate and connected to a part of the plurality of circuit elements; a first insulating pattern in the first substrate; a first insulating layer on the second surface of the first substrate; a first contact plug penetrating the first insulating pattern, extending from the metal layer in the first direction, and connected to the metal layer; a second contact plug penetrating the first insulating layer, extending in the first direction, and connected to the first contact plug; and a first input/output pad on the first insulating layer and connected to the second contact plug.

According to some example embodiments, there is provided a nonvolatile memory system including a main substrate; a nonvolatile memory device on the main substrate; and a controller on the main substrate and electrically connected to the nonvolatile memory device, wherein the nonvolatile memory device includes a first substrate including a first surface and a second surface opposite to the first surface in a first direction; a second substrate spaced apart from the first substrate in the first direction; a cell structure between the first and second substrates; a peripheral circuit structure including a circuit element configured to drive the cell structure and between the first and second substrates; an insulating pattern in the first substrate; an insulating layer on the second surface of the first substrate; a first contact plug penetrating the insulating pattern and extending in the first direction; a second contact plug penetrating the insulating layer, extending in the first direction, and connected to the first contact plug; a circuit wiring connected to the first contact plug and connected to the circuit element; and an input/output pad connected to the second contact plug and electrically connected to the circuit element.

Other features and embodiments may be apparent from the following detailed description, the drawings, and the claims.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Hereinafter, embodiments according to the technical spirit of the present disclosure will be described with reference to the accompanying drawings.

Figure 1:
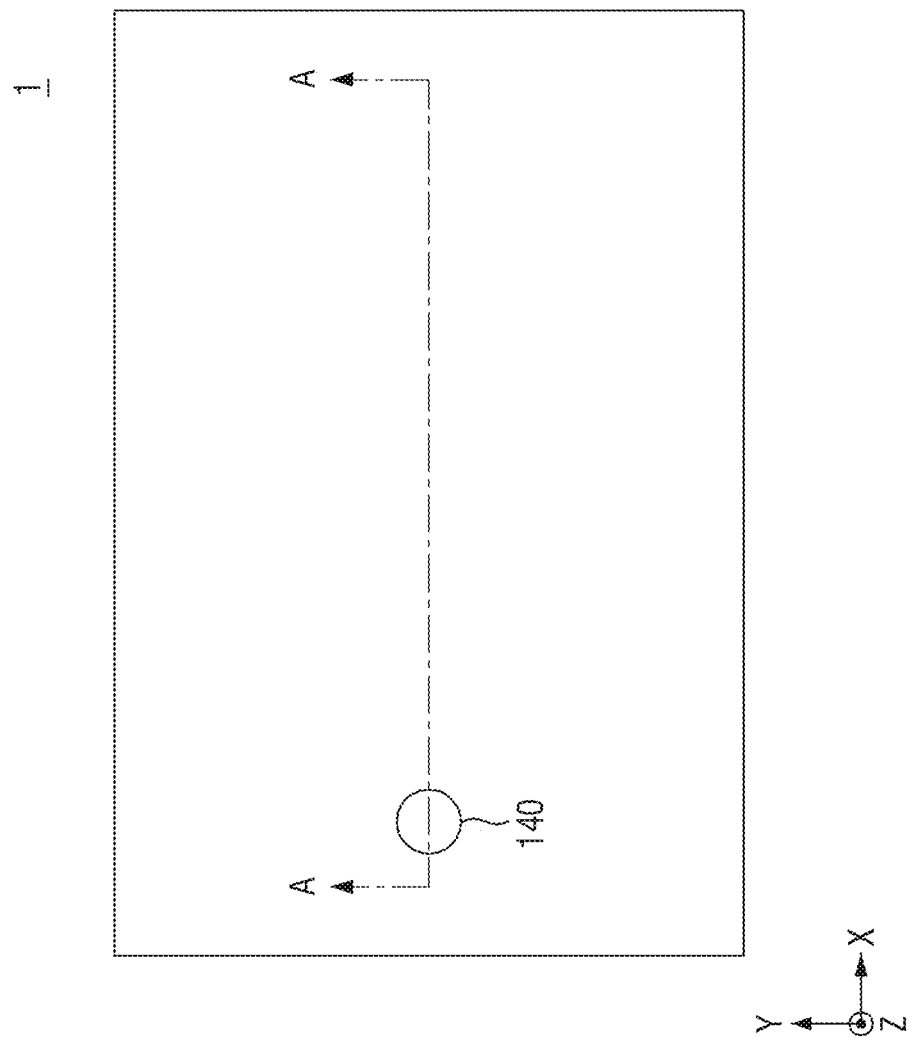
FIG. 1 is a diagram of a nonvolatile memory device according to some example embodiments.
Figure 2:
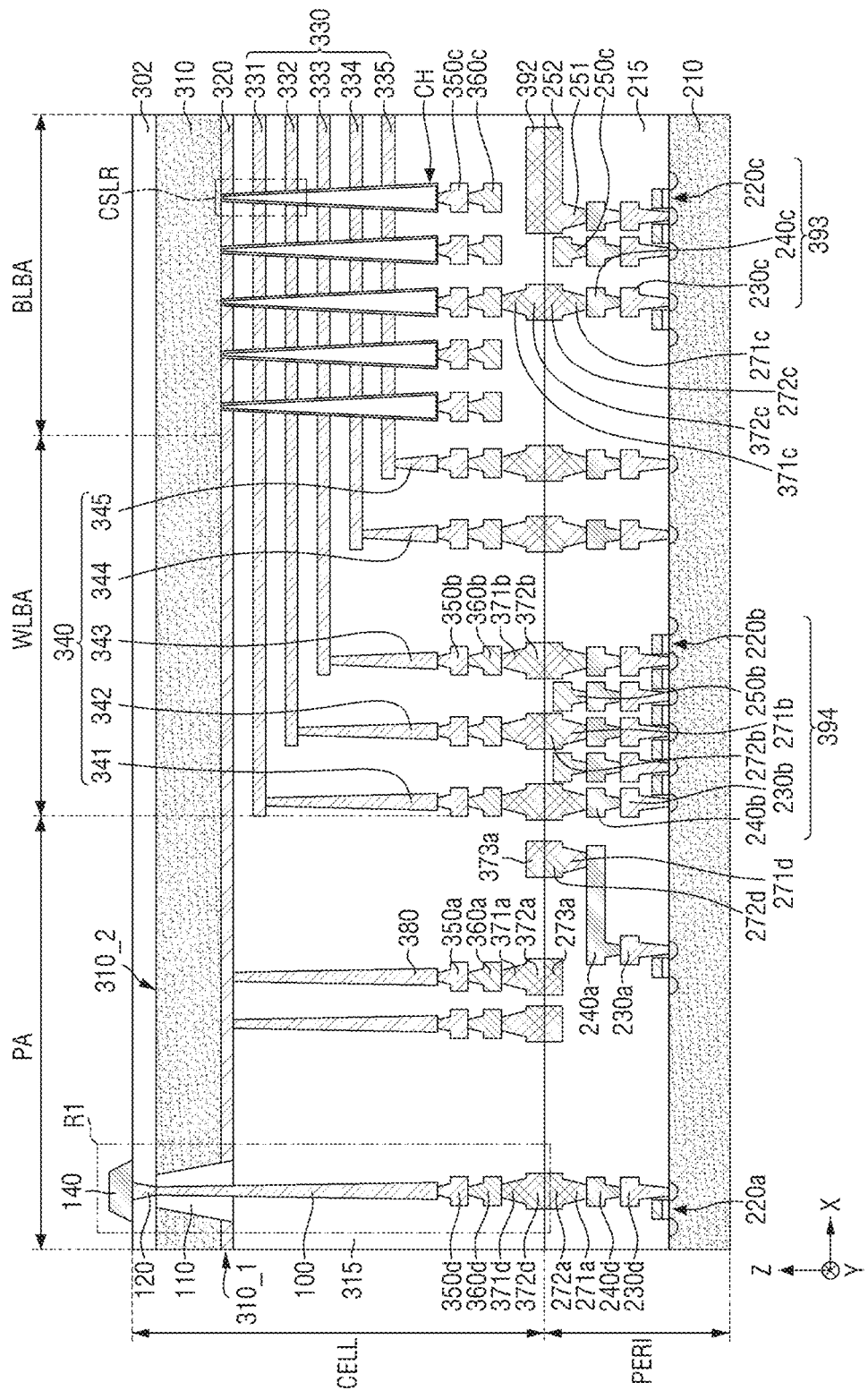
FIG. 2 is an example cross-sectional view taken along line A-A of FIG. 1.
Figure 3A:
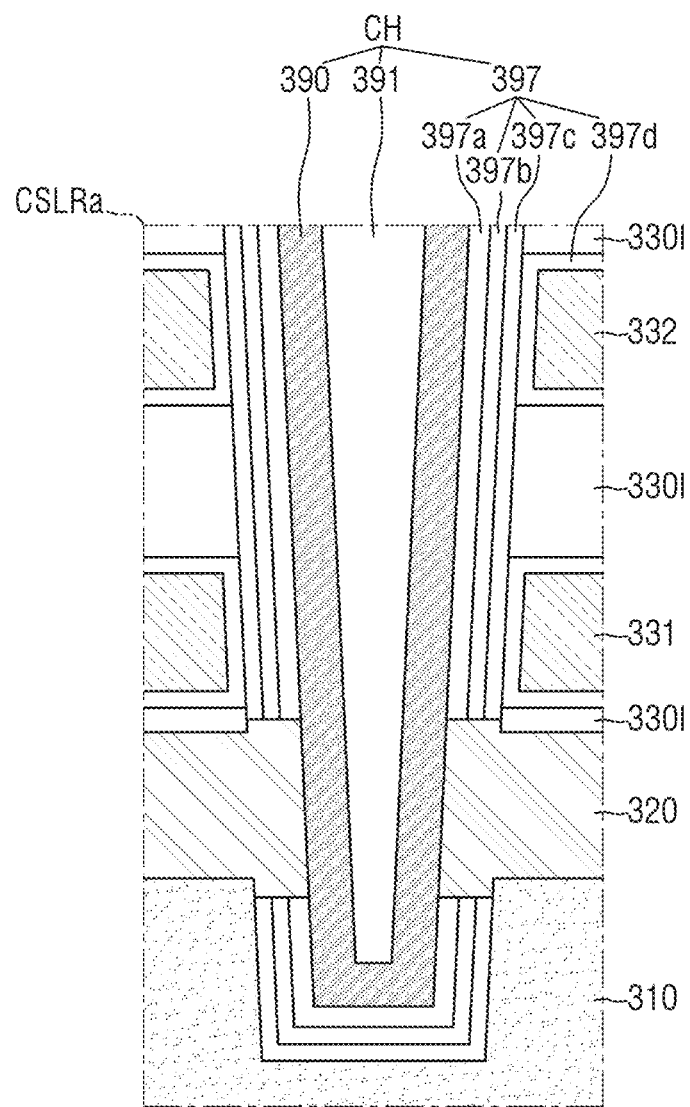
FIGS. 3A and 3B are example enlarged views of area CSLR of FIG. 2.
Figure 3B:
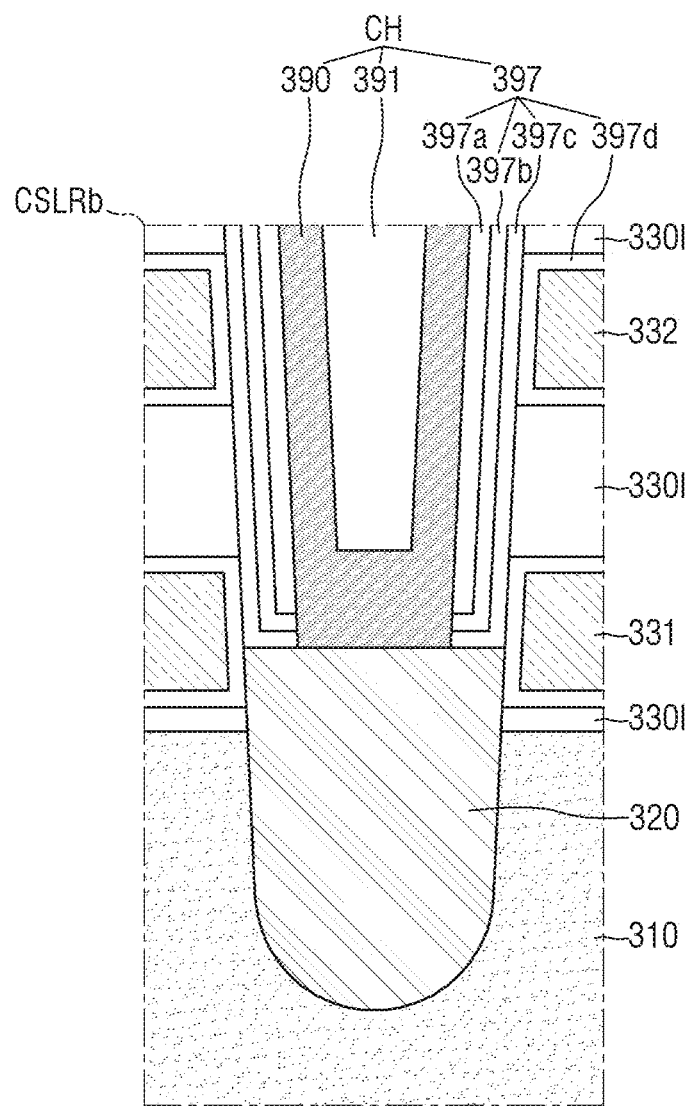
Figure 3C:
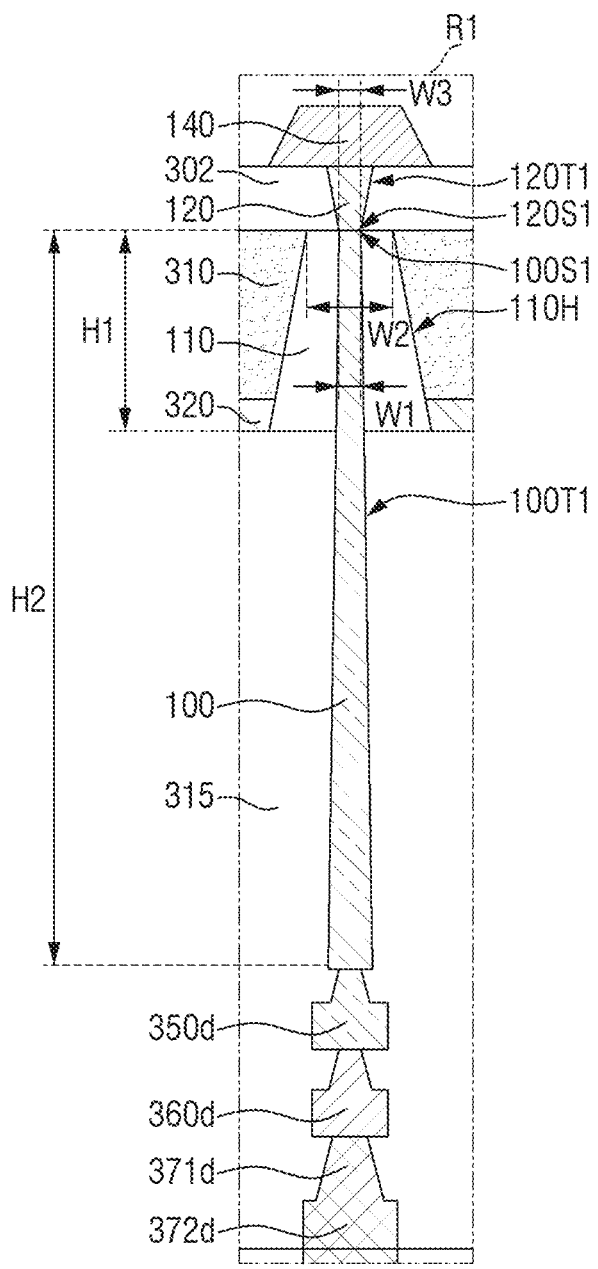
FIG. 3C is an enlarged view of area R1 of FIG. 2.

FIG. 1 is a diagram of a nonvolatile memory device according to some example embodiments. FIG. 2 is an example cross-sectional view taken along line A-A of FIG. 1. FIGS. 3A and 3B are example enlarged views of area CSLR of FIG. 2. FIG. 3C is an enlarged view of area R1 of FIG. 2.

Referring to FIGS. 1 and 2, a nonvolatile memory device 1 according to some example embodiments may have a chip-to-chip (C2C) structure. The C2C structure may mean a structure obtained by manufacturing an upper chip including a cell region CELL on a first wafer, manufacturing a lower chip including a peripheral circuit region PERI on a second wafer different from the first wafer, and connecting the upper chip and the lower chip to each other by a bonding method. In some example embodiments, the bonding method may mean a method of electrically connecting a bonding metal formed on an uppermost metal layer of the upper chip to a bonding metal formed on an uppermost metal layer of the lower chip. For example, when the bonding metal is formed of copper (Cu), the bonding method may be a Cu—Cu bonding method, and the bonding metal may also be formed of aluminum or tungsten.

The peripheral circuit region PERI and the cell region CELL of the nonvolatile memory device 1 according to some example embodiments may each include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, a first metal layer 230a, 230b, 230c, and 230d connected to each of the plurality of circuit elements 220a, 220b, and 220c, and a second metal layer 240a, 240b, 240c, and 240d formed on the first metal layer 230a, 230b, 230c, and 230d. In some example embodiments, the first metal layer 230a, 230b, 230c, and 230d may be formed of tungsten having a relatively high resistance, and the second metal layer 240a, 240b, 240c, and 240d may be formed of copper having a relatively low resistance.

In the some example embodiments, only the first metal layer 230a, 230b, 230c, and 230d and the second metal layer 240a, 240b, 240c, and 240d are illustrated and described, but the present disclosure is not limited thereto, and one or more metal layers may be further formed on the second metal layer 240a, 240b, 240c, and 240d. At least some of the one or more metal layers formed on the second metal layer 240a, 240b, 240c, and 240d may be formed of aluminum or the like having a lower resistance than copper forming the second metal layer 240a, 240b, 240c, and 240d.

The interlayer insulating layer 215 may be disposed on the first substrate 210 to cover the plurality of circuit elements 220a, 220b, and 220c, the first metal layer 230a, 230b, 230c, and 230d, and the second metal layer 240a, 240b, 240c, and 240d. For example, the interlayer insulating layer 215 may include an insulating material such as silicon oxide or silicon nitride.

Lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a bonding method. The lower bonding metals 271b and 272b and the upper bonding metals 371b and 372b may be formed of aluminum, copper, and/or tungsten.

The cell region CELL may provide at least one memory block. The cell region CELL may include a second substrate 310 and a common source line 320. The cell region CELL may include an insulating layer 302. On the second substrate 310, a plurality of word lines 330 (word lines 331 to 335) may be stacked in a third direction Z perpendicular to the top surface of the second substrate 310. String select lines and a ground select line may be disposed above and below the word lines 330, respectively, and the plurality of word lines 330 may be disposed between the string select lines and the ground select line.

In the bit line bonding area BLBA, a channel structure CH may extend in a direction perpendicular to the top surface of the second substrate 310 to penetrate the word lines 330, the string select lines, and the ground select line.

The channel structure CH may extend in the third direction Z, as shown in FIGS. 3A and 3B. The channel structure CH may include a channel layer 390, a buried insulating layer 391, a data storage layer 397, and the like. The channel layer 390 may be electrically connected to a first metal layer 350c and a second metal layer 360c. For example, the first metal layer 350c may be a bit line contact, and the second metal layer 360c may be a bit line. In some example embodiments, the bit line 360c may extend in a first direction X parallel to the top surface of the second substrate 310.

The second substrate 310, the common source line 320, and the channel structures CH of the nonvolatile memory device 1 according to some example embodiments may be formed in various shapes. Hereinafter, various example structures of the second substrate 310, the common source line 320, and the channel structures CH of the nonvolatile memory device 1 according to some example embodiments will be described with reference to enlarged views of area CSLR in FIGS. 3A and 3B.

Referring to FIGS. 2, 3A, and 3B, an insulating layer 3301 may be interposed between the common source line 320 and the word lines 331 and 332. The word lines 331 and 332, and the common source line 320 may be insulated by the insulating layer 3301.

The channel layer 390 may extend in the third direction Z. The channel layer 390 is illustrated as having a multi-layered cup shape, but this is only example. The channel layer 390 may have various shapes such as a cylindrical shape, a square tubular shape, a solid pillar shape, and a single-layered cup shape. The channel layer 390 may include, for example, a semiconductor material such as monocrystalline silicon, polycrystalline silicon, organic semiconductor material, and/or carbon nanostructure, but is not limited thereto.

The data storage layer 397 may be interposed between the channel layer 390 and the word lines 330. For example, the data storage layer 397 may extend along the side surface of the channel layer 390.

In some example embodiments, the data storage layer 397 may be formed of multiple layers. For example, the data storage layer 397 may include a tunnel insulating layer 397a, a charge storage layer 397b, and a blocking insulating layer 397c that are sequentially stacked on the channel layer 390. The tunnel insulating layer 397a may include, for example, silicon oxide or a high dielectric constant material (e.g., aluminum oxide (Al2O3) and/or hafnium oxide (HfO2)) having a higher dielectric constant than silicon oxide. The charge storage layer 397b may include, for example, silicon nitride. The blocking insulating layer 397c may include, for example, silicon oxide or a high dielectric constant material having a higher dielectric constant than that of silicon oxide. In some example embodiments, the data storage layer 397 may further include a gate insulating layer 397d extending along the surface of each word line 330.

In some example embodiments, the channel structure CH may further include the buried insulating layer 391. The buried insulating layer 391 may be formed to fill the inside of the cup-shaped channel layer 390. The buried insulating layer 391 may include an insulating material, for example, silicon oxide, but is not limited thereto.

The common source line 320 may be formed to be connected to the channel layer 390 of the channel structure CH.

In some example embodiments, as depicted in FIG. 3A, the channel structure CH may penetrate the common source line 320 to be buried in the second substrate 310. The common source line 320 may penetrate a part of the data storage layer 397 to be connected to the side surface of the channel layer 390.

In some example embodiments, as depicted in FIG. 3B, at least a part of the common source line 320 may be buried in the second substrate 310. The common source line 320 may be formed from, e.g., the second substrate 310 by a selective epitaxial growth (SEG) process. The channel structure CH may penetrate a part of a charge storage layer 397b to be connected to the top surface of the common source line 320.

Referring back to FIG. 2, an area, in which the channel structure CH and the second metal layer 360c are disposed, may be defined as the bit line bonding area BLBA. In the bit line bonding area BLBA, the second metal layer 360c may be electrically connected to the circuit elements 220c that provide a page buffer 393 in the peripheral circuit region PERI. For example, the second metal layer 360c may be connected to upper bonding metals 371c and 372c in the peripheral circuit region PERI, and the upper bonding metal 371c and 372c may be connected to lower bonding metals 271c and 272c connected to the circuit elements 220c of the page buffer 393.

Further, in the bit line bonding area BLBA, an upper metal pattern 392, which has the same shape as a lower metal pattern 252, may be formed in an uppermost metal layer of the cell region CELL to correspond to the lower metal pattern 252 formed in an uppermost metal layer of the peripheral circuit region PERI. A contact may not be formed on the upper metal pattern 392 formed in the uppermost metal layer of the cell region CELL. Lower metal patterns 251 and 252 of the peripheral circuit region PERI may be electrically connected to the circuit elements 220c.

In the word line bonding area WLBA, the word lines 330 may extend in the first direction X parallel to the top surface of the second substrate 310. The word lines 330 may be connected to a plurality of cell contact plugs 340 (cell contact plugs 341 to 345), respectively, in the word line bonding area WLBA. The word lines 330 and the cell contact plugs 340 may be connected to each other in pads provided by at least some of the word lines 330 extending with different lengths. A first metal layer 350b and a second metal layer 360b may be sequentially connected to the top portions of the cell contact plugs 340 connected to the word lines 330. In the word line bonding area WLBA, the cell contact plugs 340 may be connected to the peripheral circuit region PERI through the upper bonding metals 371b and 372b of the cell region CELL and the lower bonding metals 271b and 272b of the peripheral circuit region PERI.

The cell contact plugs 340 may be electrically connected to the circuit elements 220b that provide a row decoder 394 in the peripheral circuit region PERI. In some example embodiments, the operating voltage of the circuit elements 220b providing the row decoder 394 may be different from the operating voltage of the circuit elements 220c providing the page buffer 393. For example, the operating voltage of the circuit elements 220c providing the page buffer 393 may be greater than the operating voltage of the circuit elements 220b providing the row decoder 1394.

A common source line contact plug 380 may be disposed in the external pad bonding area PA. The common source line contact plug 380 may be formed of a conductive material such as a metal, a metal compound, or polysilicon, and may be electrically connected to the common source line 320. A first metal layer 350a and a second metal layer 360a may be sequentially stacked on the common source line contact plug 380. In some example embodiments, an area in which the common source line contact plug 380, the first metal layer 350a, and the second metal layer 360a are disposed may be defined as the external pad bonding area PA.

The peripheral circuit region PERI may include the first metal layer 230a, the second metal layer 240a, and lower bonding metals 271d and 272d. The first and second metal layers 230a and 240a, and the lower bonding metals 271d and 272d may be disposed in the external pad bonding area PA. The circuit elements 220a, 220b, and 220c may be electrically connected to a bonding pad 373a of the cell region CELL through the first and second metal layers 230a and 240a, and the lower bonding metals 271d and 272d.

The peripheral circuit region PERI may include the first metal layer 230d, the second metal layer 240d, and lower bonding metals 271a and 272a. The first and second metal layers 230d and 240d, and the lower bonding metals 271a and 272a may be disposed in the external pad bonding area PA. The circuit elements 220a may be electrically connected to upper bonding metals 371d and 372d of the cell region CELL through the first and second metal layers 230d and 240d, and the lower bonding metals 271a and 272a. That is, the lower bonding metals 271a and 272a may be bonded to the upper bonding metals 371d and 372d. The upper bonding metals 371d and 372d may be connected to a first metal layer 350d and a second metal layer 360d.

In each of the external pad bonding area PA and the bit line bonding area BLBA included in each of the cell region CELL and the peripheral circuit region PERI, an uppermost metal layer may have a metal pattern existing as a dummy pattern, or may be empty.

The nonvolatile memory device 1 may include a lower metal pattern 273a, which is formed in the uppermost metal layer of the peripheral circuit region PERI to correspond an upper bonding metal 372a formed in the uppermost metal layer of the cell region CELL, in the external pad bonding area PA. The lower metal pattern 273a formed on the uppermost metal layer of the peripheral circuit region PERI may not be connected to a separate contact in the peripheral circuit region PERI. Similarly, in the external pad bonding area PA, corresponding to the lower metal pattern formed in the uppermost metal layer of the peripheral circuit region PERI, the upper metal pattern having the same shape as the lower metal pattern of the peripheral circuit region PERI may be formed in the upper metal layer of the cell region CELL.

Lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a bonding method.

In addition, in the bit line bonding area BLBA, corresponding to the lower metal pattern 252 formed in the uppermost metal layer of the peripheral circuit region PERI, the upper metal pattern 392 having the same shape as the lower metal pattern 252 of the peripheral circuit region PERI may be formed in the uppermost metal layer of the cell region CELL. A contact may not be formed on the upper metal pattern 392 formed in the uppermost metal layer of the cell region CELL.

The second substrate 310 may include a first surface 310_1 and a second surface 310_2. The common source line 320 may be disposed on the first surface 310_1 of the second substrate 310.

An insulating pattern 110 may be formed in the second substrate 310. The insulating pattern 110 may be formed in the second substrate 310 and the common source line 320. Although FIG. 2 illustrates that the insulating pattern 110 is formed in the common source line 320, embodiments according to the technical spirit of the present disclosure are not limited thereto. For example, the insulating pattern 110 may be disposed to be spaced apart from the common source line 320. That is, the common source line 320 may not entirely cover the second substrate 310.

The insulating pattern 110 may include an insulating material. For example, the insulating pattern 110 may include silicon oxide such as borosilicate glass (BSG), phosphosilicate glass (PSG), borophosphosilicate glass (BPSG), undoped silicate glass (USG), tetraethyl orthosilicate glass (TEOS), and/or high density plasma chemical vapor deposition (HDP-CVD) oxide, but the present disclosure is not limited thereto.

The insulating pattern 110 may be exposed at the first surface 310_1 and the second surface 310_2 of the second substrate 310. For example, the bottom surface of the insulating pattern 110 may be exposed at the first surface 310_1, and the top surface thereof may be exposed at the second surface 310_2. The sidewall of the insulating pattern 110 may be surrounded by the second substrate 310. The width of the bottom surface of the insulating pattern 110 may be greater than the width of the top surface of the insulating pattern 110. However, embodiments according to the technical spirit of the present disclosure are not limited thereto.

The insulating layer 302 may be formed on the second substrate 310. The insulating layer 302 may be formed on the second surface 310_2 of the second substrate 310. The insulating layer 302 may extend in the first direction X. That is, the insulating layer 302 may entirely cover the second substrate 310. Further, the insulating layer 302 may cover the insulating pattern 110.

The insulating layer 302 may include an insulating material. For example, the insulating layer 302 may include silicon oxide such as borosilicate glass (BSG), phosphosilicate glass (PSG), borophosphosilicate glass (BPSG), undoped silicate glass (USG), tetraethyl orthosilicate glass (TEOS), and/or high density plasma chemical vapor deposition (HDP-CVD) oxide, but the present disclosure is not limited thereto.

An interlayer insulating layer 315 may be formed on the second substrate 310. That is, the interlayer insulating layer 315 may be formed to cover the first surface 310_1 of the second substrate 310. The interlayer insulating layer 315 may cover the common source line 320, the word lines 330, the channel structure CH, the cell contact plugs 340, the first metal layers 350a, 350b, 350c, and 350d, the second metal layers 360a, 360b, 360c, and 360d, the upper bonding metals 371a, 371b, 371c, 371d, 372a, 372b, 372c, and 372d, and the like.

The interlayer insulating layer 315 may include an insulating material. For example, the interlayer insulating layer 315 may include silicon oxide such as borosilicate glass (BSG), phosphosilicate glass (PSG), borophosphosilicate glass (BPSG), undoped silicate glass (USG), tetraethyl orthosilicate glass (TEOS), and/or high density plasma chemical vapor deposition (HDP-CVD) oxide, but the present disclosure is not limited thereto.

A first contact plug 100 may extend from the first metal layer 350d. The first contact plug 100 may penetrate the interlayer insulating layer 315 and the insulating pattern 110. That is, the first contact plug 100 may extend to penetrate the interlayer insulating layer 315 and the insulating pattern 110. The first contact plug 100 may extend in the third direction Z. The bottom surface of the first contact plug 100 may be in contact with the first metal layer 350d. The top surface of the first contact plug 100 may be exposed at the top surface of the insulating pattern 110. The width of the bottom surface of the first contact plug 100 may be greater than the width of the top surface of the first contact plug 100.

The first contact plug 100 may include the same conductive material as the common source line contact plug 380 and the cell contact plugs 340. For example, the first contact plug 100 may include a conductive material such as a metal, a metal compound, and/or polysilicon.

A second contact plug 120 may be disposed in the insulating layer 302. The sidewall of the second contact plug 120 may be surrounded by the insulating layer 302. The second contact plug 120 may extend in the third direction Z. The second contact plug 120 may be in contact with the first contact plug 100. The first contact plug 100 may be electrically connected to the second contact plug 120. Further, a part of the second contact plug 120 may be in contact with the insulating pattern 110. The second contact plug 120 may be a backside via for stack (BVS).

The second contact plug 120 may penetrate the insulating layer 302. That is, the top and bottom surfaces of the second contact plug 120 may be exposed at the top and bottom surfaces of the insulating layer 302, respectively.

The second contact plug 120 may include the same conductive material as the first contact plug 100. For example, the second contact plug 120 may include a conductive material such as a metal, a metal compound, and/or polysilicon.

An input/output pad 140 may be formed on the insulating layer 302. The input/output pad 140 may cover the second contact plug 120. The input/output pad 140 may be connected to the second contact plug 120 exposed at the top surface of the insulating layer 302. That is, the input/output pad 140 may be in contact with the second contact plug 120.

The input/output pad 140 may be connected to at least one of the circuit element 220a, 220b, or 220c disposed in the peripheral circuit region PERI through the first and second contact plugs 100 and 120. The input/output pad 140 may be separated from the second substrate 310 by the insulating layer 302.

Referring to FIG. 3C, the insulating pattern 110 may be formed in the second substrate 310. A hole 110H may be formed to penetrate the second substrate 310. The insulating pattern 110 may be formed in the hole 110H of the second substrate 310. The insulating pattern 110 may fill the hole 110H. The width of the insulating pattern 110 in the first direction X may be a second width W2. However, embodiments according to the technical spirit of the present disclosure are not limited thereto, and the width of the insulating pattern 110 in a second direction Y may be the second width W2. Here, the second width W2 may be the width of the top surface or the width of the bottom surface of the insulating pattern 110. The height of the insulating pattern 110 in the third direction Z may be a first height H1.

A first trench 100T1 may be formed in the interlayer insulating layer 315 and the insulating pattern 110. The first trench 100T1 may penetrate the interlayer insulating layer 315 and the insulating pattern 110. The first contact plug 100 may be formed in the first trench 100T1. The first contact plug 100 may fill the first trench 100T1. A first surface 100S1 of the first contact plug 100 may be exposed at the top surface of the insulating pattern 110.

The width of the first contact plug 100 in the first direction X may be a first width W1. However, embodiments according to the technical spirit of the present disclosure are not limited thereto, and the width of the first contact plug 100 in the second direction Y may be the first width W1. Here, the first width W1 may be the width of the top surface or the width of the bottom surface of the first contact plug 100. The height of the first contact plug 100 in the third direction Z may be a second height H2.

The second width W2 of the insulating pattern 110 may be greater than the first width W1 of the first contact plug 100. The first height H1 of the insulating pattern 110 may be smaller than the second height H2 of the first contact plug 100. That is, the insulating pattern 110 may surround a part of the first contact plug 100. Further, the interlayer insulating layer 315 may surround the other part of the first contact plug 100.

A second trench 120T1 may be formed in the insulating layer 302. The second trench 120T1 may penetrate the insulating layer 302. The second contact plug 120 may be formed in the second trench 120T1. The second contact plug 120 may fill the second trench 120T1. A second surface 120S1 of the second contact plug 120 may be exposed at the bottom surface of the insulating layer 302.

The second surface 120S1 of the second contact plug 120 may be in contact with the first surface 100S1 of the first contact plug 100. Accordingly, the first contact plug 100 may be connected to the second contact plug 120.

The width of the second contact plug 120 in the first direction X may be a third width W3. The third width W3 of the second contact plug 120 may be the width of the top surface or the width of the bottom surface of the second contact plug 120. The third width W3 of the second contact plug 120 may be smaller than the second width W2 of the insulating pattern 110. The second contact plug 120 may be formed to correspond to the first contact plug 100.

The input/output pad 140 may be electrically connected to at least one of the circuit element 220a, 220b, or 220c by the first contact plug 100 formed in the insulating pattern 110 and the second contact plug 120 formed in the insulating layer 302. Since the first and second contact plugs 100 and 120 are formed after the insulating pattern 110 is formed in the second substrate 310, the first and second contact plugs 100 and 120 may be formed without performing a separate process on the second substrate 310. That is, in some example embodiments, it is possible to improve the reliability in the process of forming the first and second contact plugs 100 and 120.

FIGS. 4 to 9 are example views for steps in a method of fabricating a nonvolatile memory device according to some example embodiments.

Figure 4:
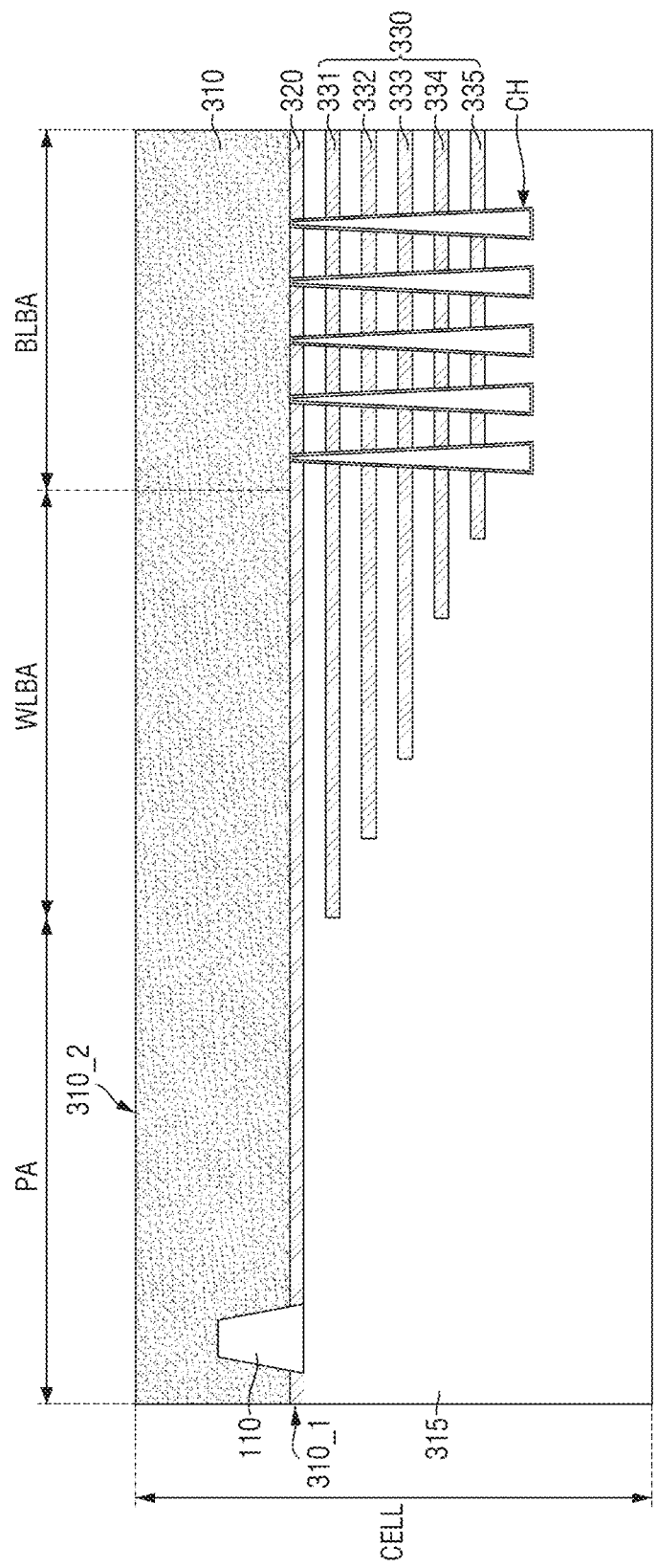
FIGS. 4 to 9 are example views for steps in a method of fabricating a nonvolatile memory device according to some example embodiments.

Referring to FIG. 4, the channel structure CH extending in the third direction Z, the common source line 320, and the stacked word lines 330 may be formed on the second substrate 310. The insulating pattern 110 may be formed in the second substrate 310 and the common source line 320. Although the drawing illustrates that the insulating pattern 110 is formed in both the second substrate 310 and the common source line 320, embodiments according to the technical spirit of the present disclosure are not limited thereto. For example, the insulating pattern 110 may be formed in the second substrate 310 and may not be formed in the common source line 320. That is, the insulating pattern 110 may be spaced apart from the common source line 320.

The insulating pattern 110 may be formed to fill a trench of the second substrate 310. In other words, the trench is formed in the first surface 310_1 of the second substrate 310, and the insulating pattern 110 may fill the trench. The exposed surface of the insulating pattern 110 may be parallel with the first surface 310_1.

The interlayer insulating layer 315 may cover the second substrate 310. That is, the interlayer insulating layer 315 may cover the second substrate 310, the common source line 320, the word lines 330, the channel structure CH and the insulating pattern 110.

Figure 5:
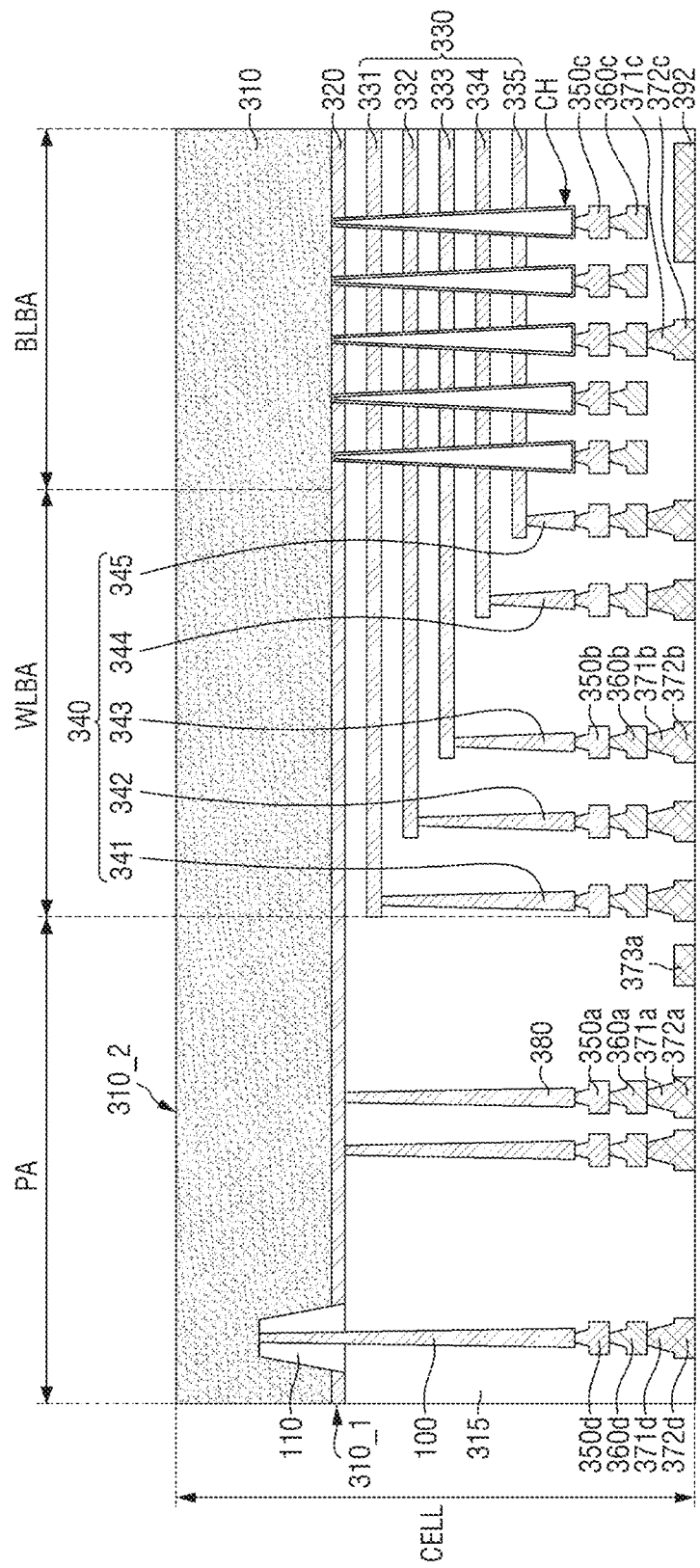

Referring to FIG. 5, the cell contact plugs 340, the common source line contact plug 380, the first contact plug 100, and the like may be formed. The cell contact plugs 340, the common source line contact plug 380, and the first contact plug 100 may extend in the interlayer insulating layer 315. In this case, the first contact plug 100 may be formed to penetrate the interlayer insulating layer 315 and the insulating pattern 110. The first contact plug 100 may extend to the surface at which the insulating pattern 110 is connected to the second substrate 310. Thus, the length of the first contact plug 100 may be greater than the lengths of the cell contact plugs 340, the channel structure CH, and the common source line contact plug 380.

Figure 6:
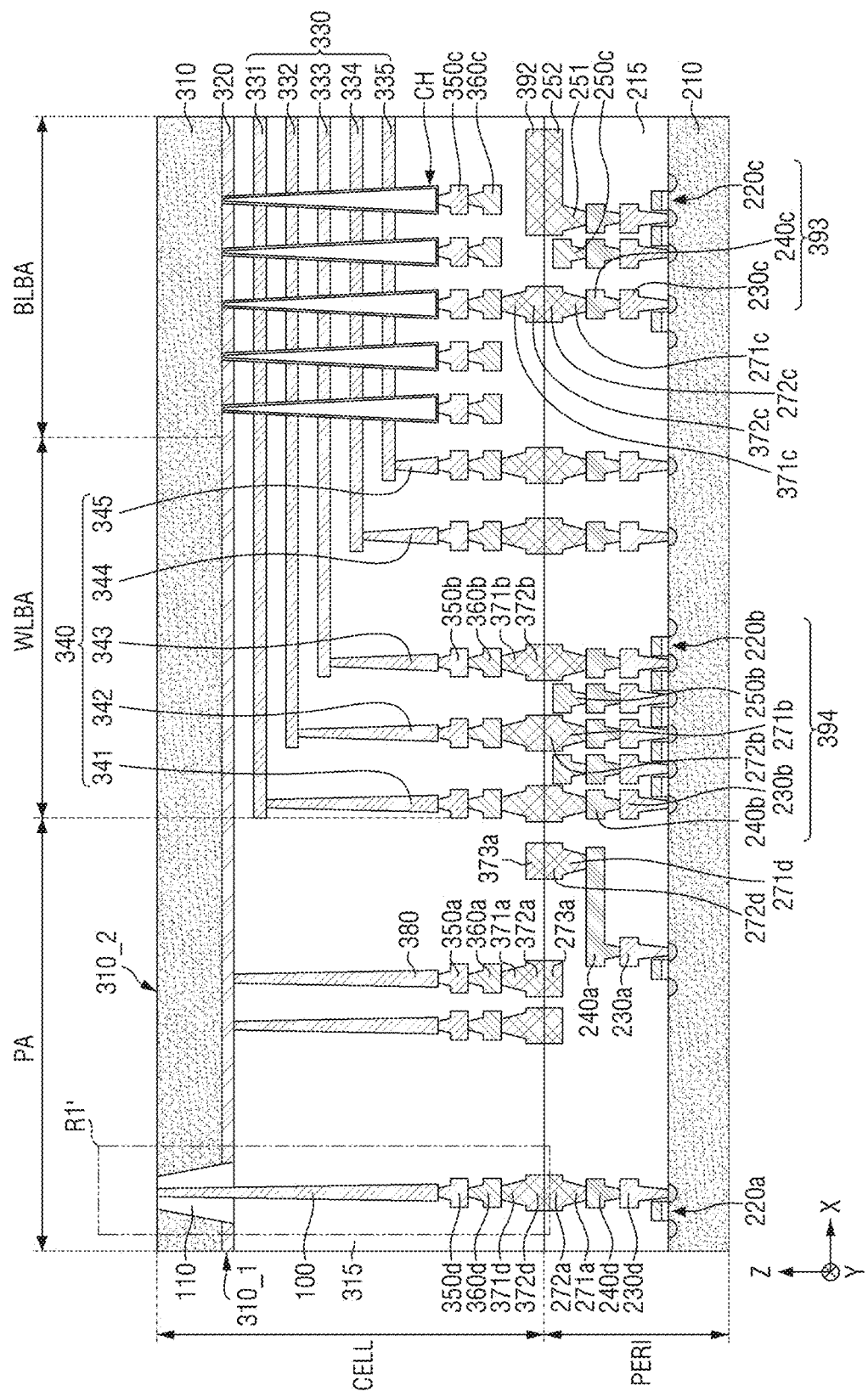

Referring to FIG. 6, the cell region CELL may be bonded to the peripheral circuit region PERI. That is, the upper bonding metals 372a, 372b, 372c and 372d, the bonding pad 373a, and the upper metal pattern 392 of the cell region CELL may be bonded to the lower bonding metals 272a, 272b, 272c and 272d, and the lower metal patterns 273a and 252 of the peripheral circuit region PERI. Accordingly, the cell region CELL may be electrically connected to the peripheral circuit region PERI. In other words, the memory elements of the cell region CELL may be electrically connected to the circuit elements 220a, 220b and 220c of the peripheral circuit region PERI.

After the cell region CELL is bonded to the peripheral circuit region PERI, the second surface 310_2 of the second substrate 310 of the cell region CELL may be polished. For example, the second surface 310_2 of the second substrate 310 may be subjected to thinning. That is, the thickness of the second substrate 310 in the third direction Z may decrease. As the second substrate 310 is polished, the top surface of the insulating pattern 110 may be exposed at the top surface of the second substrate 310. In addition, the top surface of the first contact plug 100 may also be exposed.

Figure 7:
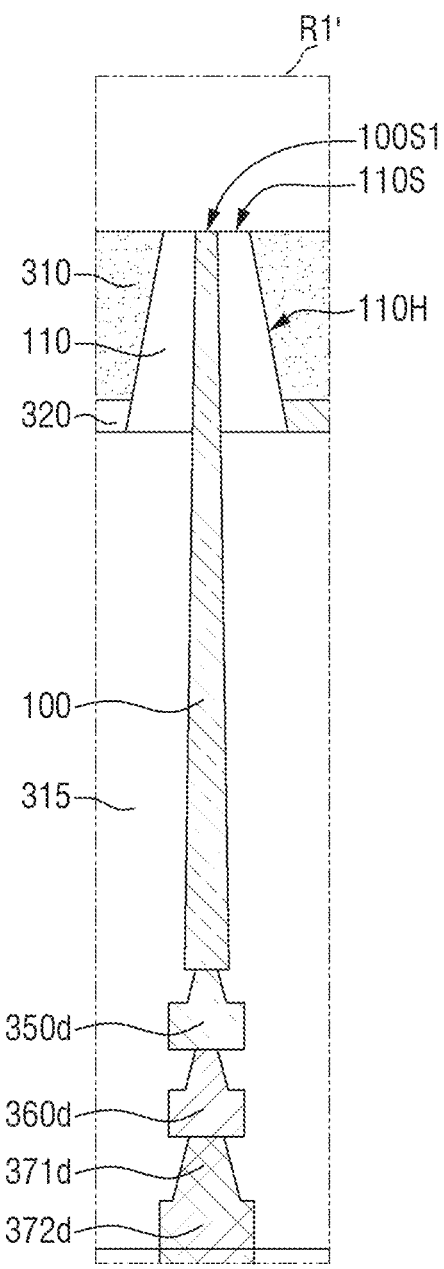

Referring to FIG. 7, the insulating pattern 110 may be disposed in the hole 110H. That is, the insulating pattern 110 formed in the trench may be exposed as the second substrate 310 is polished, and consequently, the insulating pattern 110 may be disposed in the hole 110H. The polished second surface 310_2 of the second substrate 310 may be parallel with an exposed surface 110S of the insulating pattern 110. Further, the polished second surface 310_2 of the second substrate 310 may be parallel with the exposed first surface 100S1 of the first contact plug 100. However, embodiments according to the technical spirit of the present disclosure are not limited thereto, and the second surface 310_2, the exposed surface 110S of the insulating pattern 110, and the exposed first surface 100S1 of the first contact plug 100 may not be parallel with each other.

Figure 8:
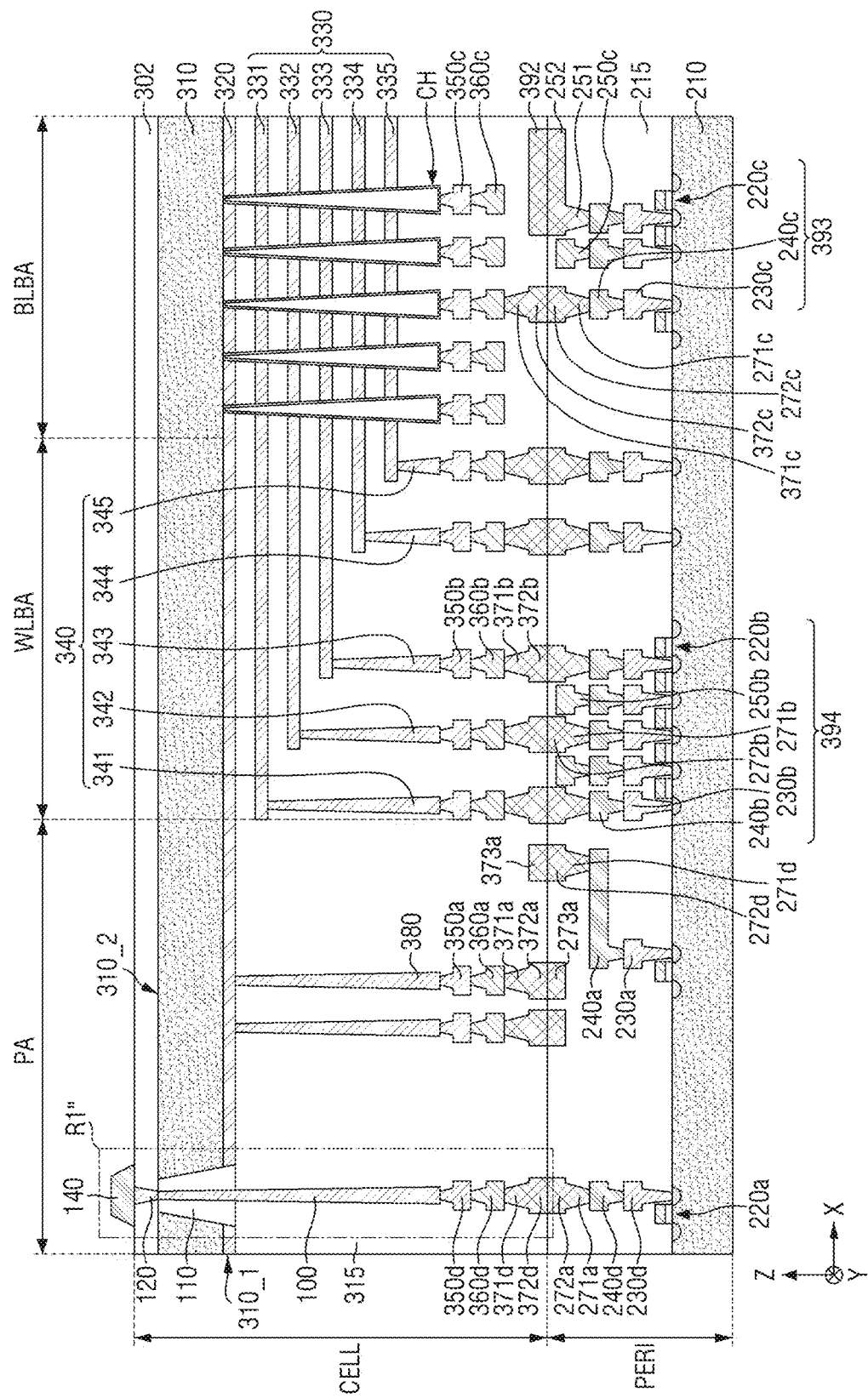

Referring to FIG. 8, the insulating layer 302 may be formed on the polished second substrate 310. The second contact plug 120 may be formed in the insulating layer 302. The input/output pad 140 may be formed on the insulating layer 302. The input/output pad 140 may cover the second contact plug 120.

Figure 9:
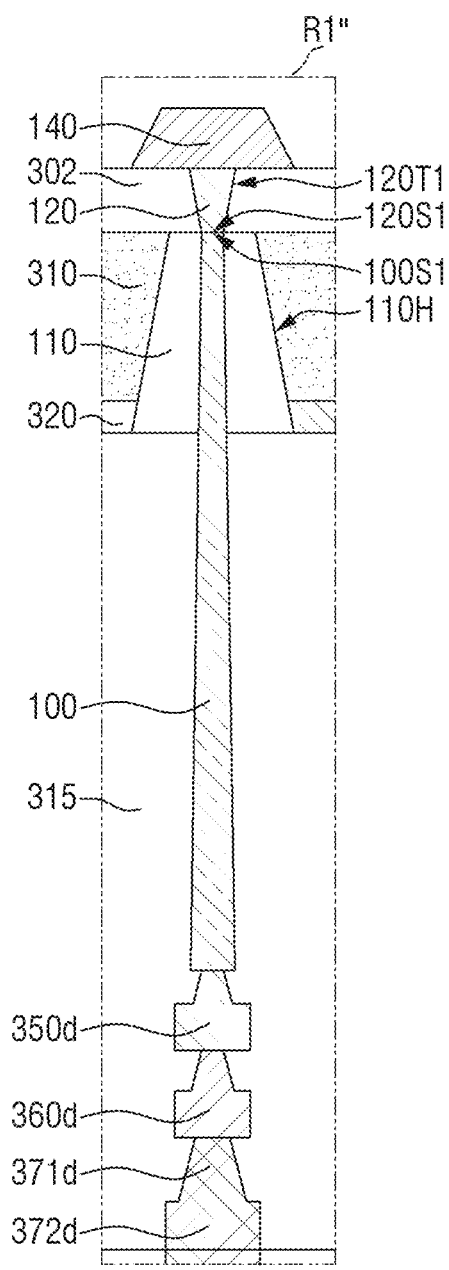

Referring to FIG. 9, the insulating layer 302 may cover the second substrate 310, the insulating pattern 110, and the first contact plug 100. That is, the insulating layer may entirely cover the second substrate 310. The second trench 120T1 may be formed in the insulating layer 302. As the second trench 120T1 is formed, the first surface 100S1 of the first contact plug 100 may be exposed. That is, the first surface 100S1 may be exposed at the bottom of the second trench 120T1.

The second contact plug 120 may fill the second trench 120T1. The second contact plug 120 may be formed in the insulating layer 302. The second surface 120S1 of the second contact plug 120 may be in contact with the first surface 100S1 of the first contact plug 100. Accordingly, the second contact plug 120 may be directly connected to the first contact plug 100.

The input/output pad 140 may be disposed on the insulating layer 302. The input/output pad 140 may be in contact with the second contact plug 120. Therefore, the input/output pad 140 may be electrically connected to the first and second contact plugs 100 and 120.

Hereinafter, a nonvolatile memory device 1 according to some other example embodiments will be described with reference to FIGS. 10 and 11.

Figure 10:
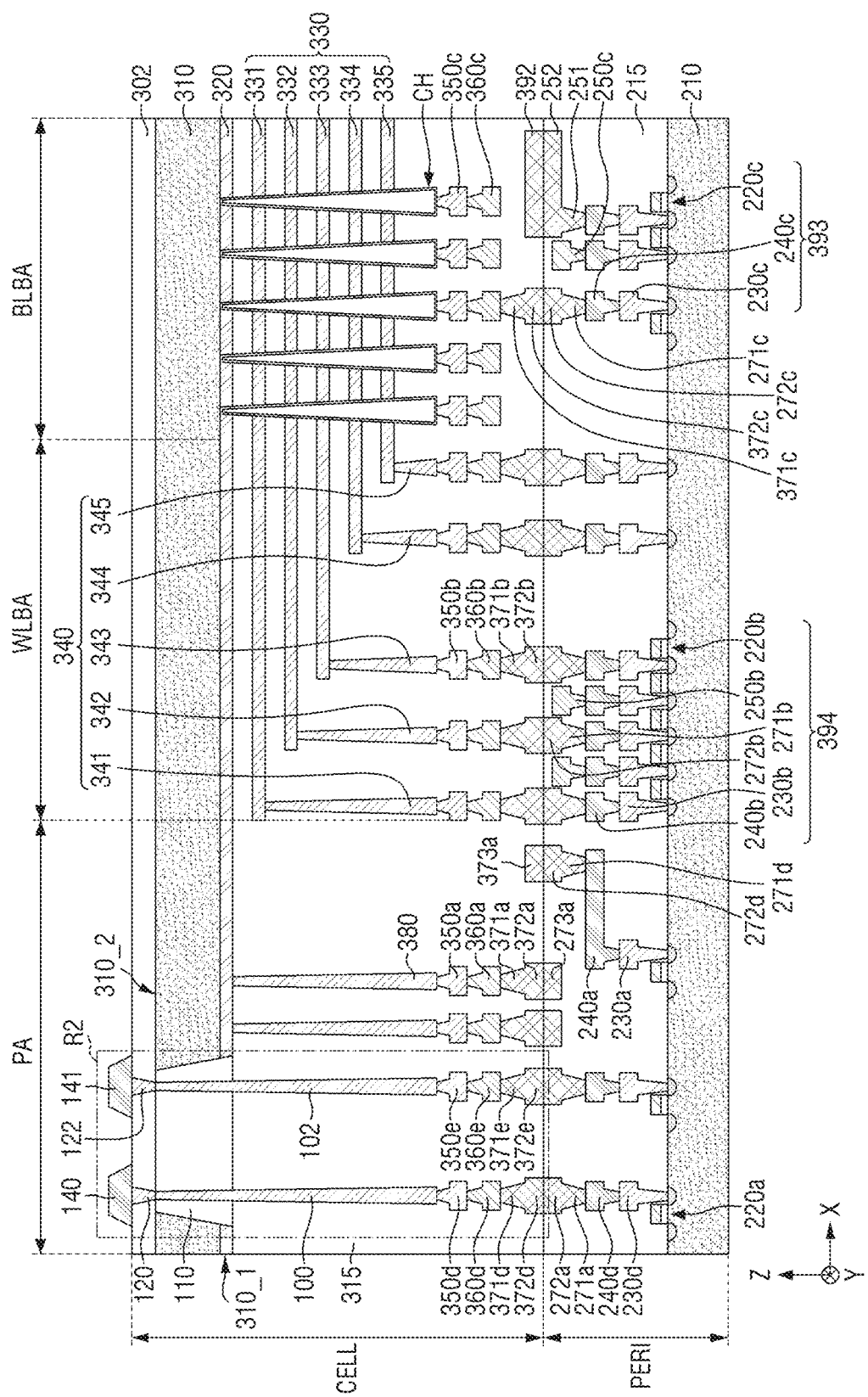
FIG. 10 is an example cross-sectional view of a nonvolatile memory device according to some example embodiments.

FIG. 10 is an example cross-sectional view of a nonvolatile memory device according to some example embodiments. FIG. 11 is an enlarged view of area R2 of FIG. 10. For simplicity of description, redundant parts of the description made with reference to FIGS. 1 to 9 will be recapitulated or omitted.

Figure 11:
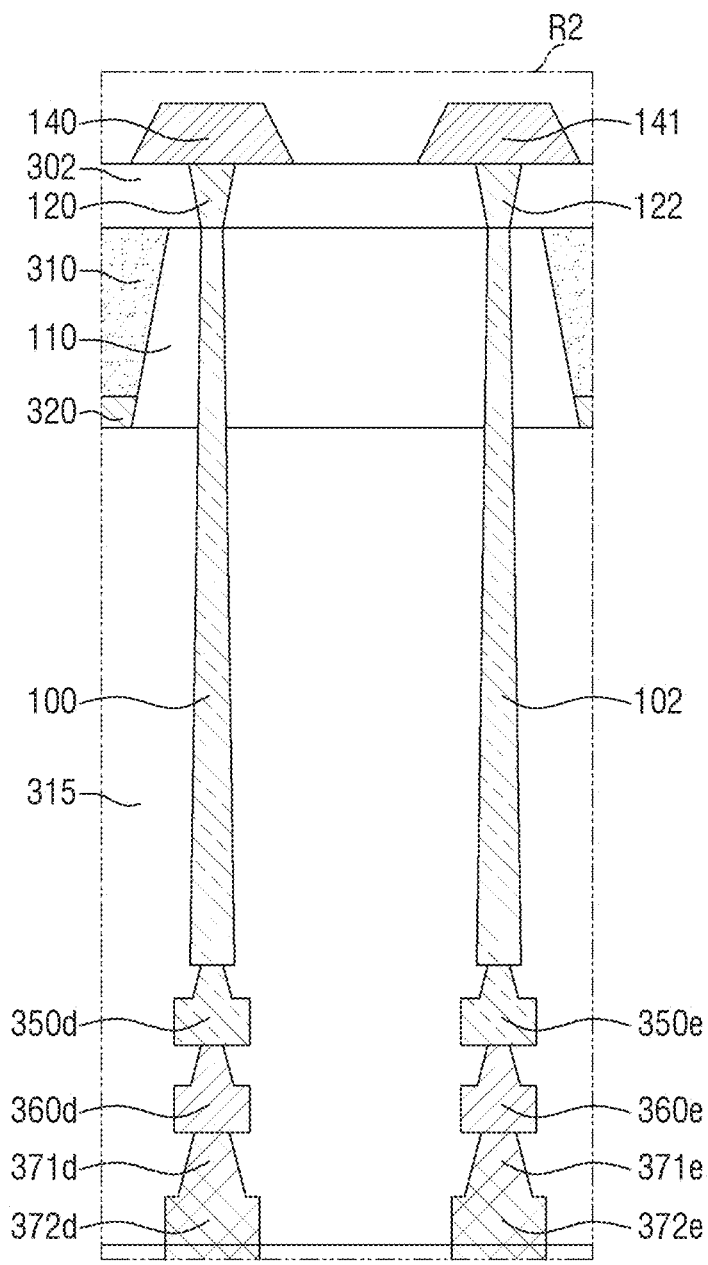
FIG. 11 is an enlarged view of area R2 of FIG. 10.

Referring to FIGS. 10 and 11, the nonvolatile memory device 1 may include a first contact plug 102, a second contact plug 122, an input/output pad 141, a first metal layer 350e, a second metal layer 360e, and upper bonding metals 371e and 372e.

The first contact plug 102 may be formed in the insulating pattern 110 and the interlayer insulating layer 315. That is, the first contact plug 102 may be formed to penetrate the insulating pattern 110 and the interlayer insulating layer 315. The first contact plug 102 may be formed in the insulating pattern 110 together with the first contact plug 100. Both the first contact plugs 100 and 102 may be surrounded by the insulating pattern 110.

The first contact plug 102 may be different from the first contact plug 100. For example, the first contact plug 102 may be connected to the first and second metal layers 350e and 360e, and the upper bonding metals 371e and 372e. The first contact plug 102 may be spaced apart from the first contact plug 100 in the first direction X.

The second contact plug 122 may be formed in the insulating layer 302. That is, the second contact plug 122 may be formed to penetrate the insulating layer 302. The second contact plug 122 may be formed in the insulating layer 302 together with the second contact plug 120. Both the second contact plugs 120 and 122 may be surrounded by the insulating layer 302.

The second contact plug 122 may be different from the second contact plug 120. For example, the second contact plug 122 may be connected to the first contact plug 102. The second contact plug 122 may be spaced apart from the second contact plug 120 in the first direction X.

The input/output pad 141 may be formed on the insulating layer 302. The input/output pad 141 may be connected to the second contact plug 122. The input/output pad 141 may be spaced apart from the input/output pad 140. The input/output pad 141 may transmit and receive a signal which is different from the signal transmitted and received by the input/output pad 140. Consequently, the nonvolatile memory device 1 may transmit and receive more data through the first and second contact plugs 102 and 122, and the input/output pad 141.

Hereinafter, a nonvolatile memory device 1 according to some other example embodiments will be described with reference to FIGS. 12 and 13.

Figure 12:
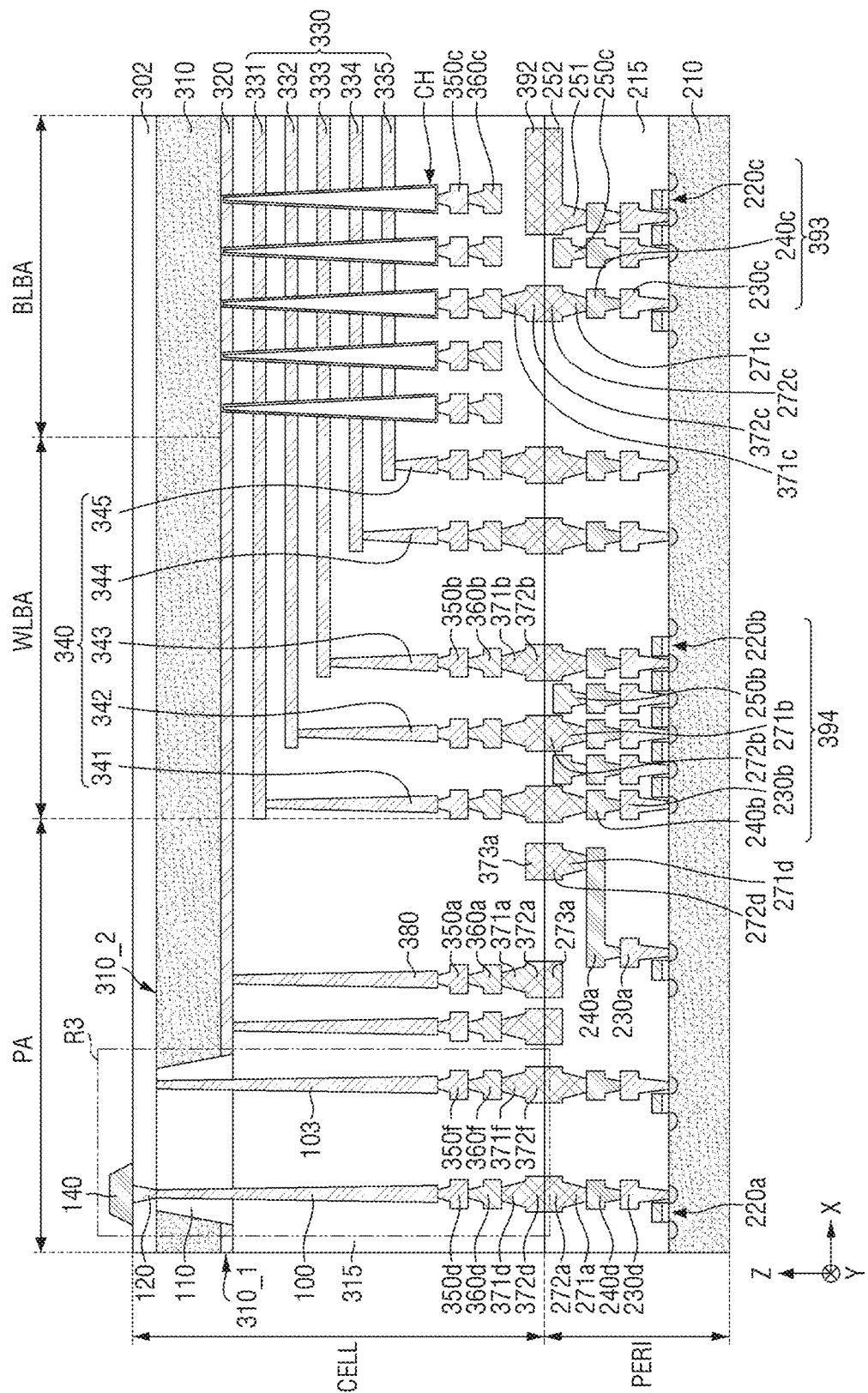
FIG. 12 is an example cross-sectional view of a nonvolatile memory device according to some example embodiments.

FIG. 12 is an example cross-sectional view of a nonvolatile memory device according to some example embodiments. FIG. 13 is an enlarged view of area R3 of FIG. 12. For simplicity of description, redundant parts of the description made with reference to FIGS. 1 to 9 will be recapitulated or omitted.

Figure 13:
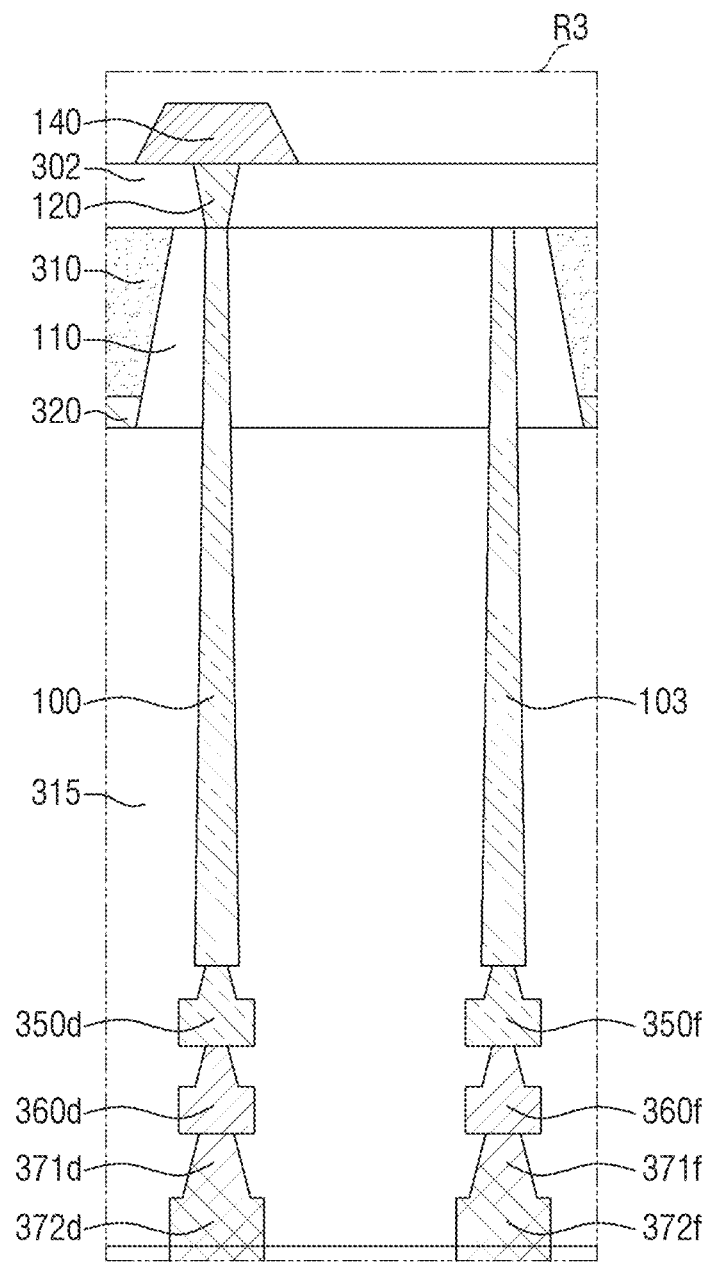
FIG. 13 is an enlarged view of area R3 of FIG. 12.

Referring to FIGS. 12 and 13, the nonvolatile memory device 1 may include a dummy contact plug 103, a first metal layer 350f, a second metal layer 360f, and upper bonding metals 371f and 372f.

The dummy contact plug 103 may be formed in the insulating pattern 110 and the interlayer insulating layer 315. That is, the dummy contact plug 103 may be formed to penetrate the insulating pattern 110 and the interlayer insulating layer 315. The dummy contact plug 103 may be formed in the insulating pattern 110 together with the first contact plug 100. Both the dummy contact plug 103 and the first contact plug 100 may be surrounded by the insulating pattern 110.

The dummy contact plug 103 may be different from the first contact plug 100. For example, the dummy contact plug 103 may be connected to the first and second metal layers 350f and 360f, and the upper bonding metals 371f and 372f. The dummy contact plug 103 may be spaced apart from the first contact plug 100 in the first direction X.

The top surface of the dummy contact plug 103 may be in contact with the insulating layer 302. That is, the insulating layer 302 may be formed on the dummy contact plug 103. The dummy contact plug 103 may not be in contact with the second contact plug 120. The dummy contact plug 103 may not be connected to the second contact plug 120 and the input/output pad 140.

The first and second metal layers 350f and 360f, and the upper bonding metals 371f and 372f may be connected to the same circuit element as the first and second metal layers 350d and 360d and the upper bonding metals 371d and 372d, among the circuit elements 220a, 220b, and 220c of the peripheral circuit region PERI. However, embodiments according to the technical spirit of the present disclosure are not limited thereto.

The second contact plug 120 may be connected to the first contact plug 100 to be electrically connected to at least one of the circuit element 220a, 220b, or 220c. However, the second contact plug 120 may be connected to the dummy contact plug 103 to be electrically connected to at least one of the circuit element 220a, 220b, or 220c. That is, at least one of the first contact plug 100 or the dummy contact plug 103 may be connected to the second contact plug 120. In other words, when the second contact plug 120 is connected to any one of the first contact plug 100 and the dummy contact plug 103, the second contact plug 120 may be electrically connected to at least one of the circuit element 220a, 220b, or 220c.

Hereinafter, a nonvolatile memory device 1 according to some example embodiments will be described with reference to FIGS. 14 and 15.

Figure 14:
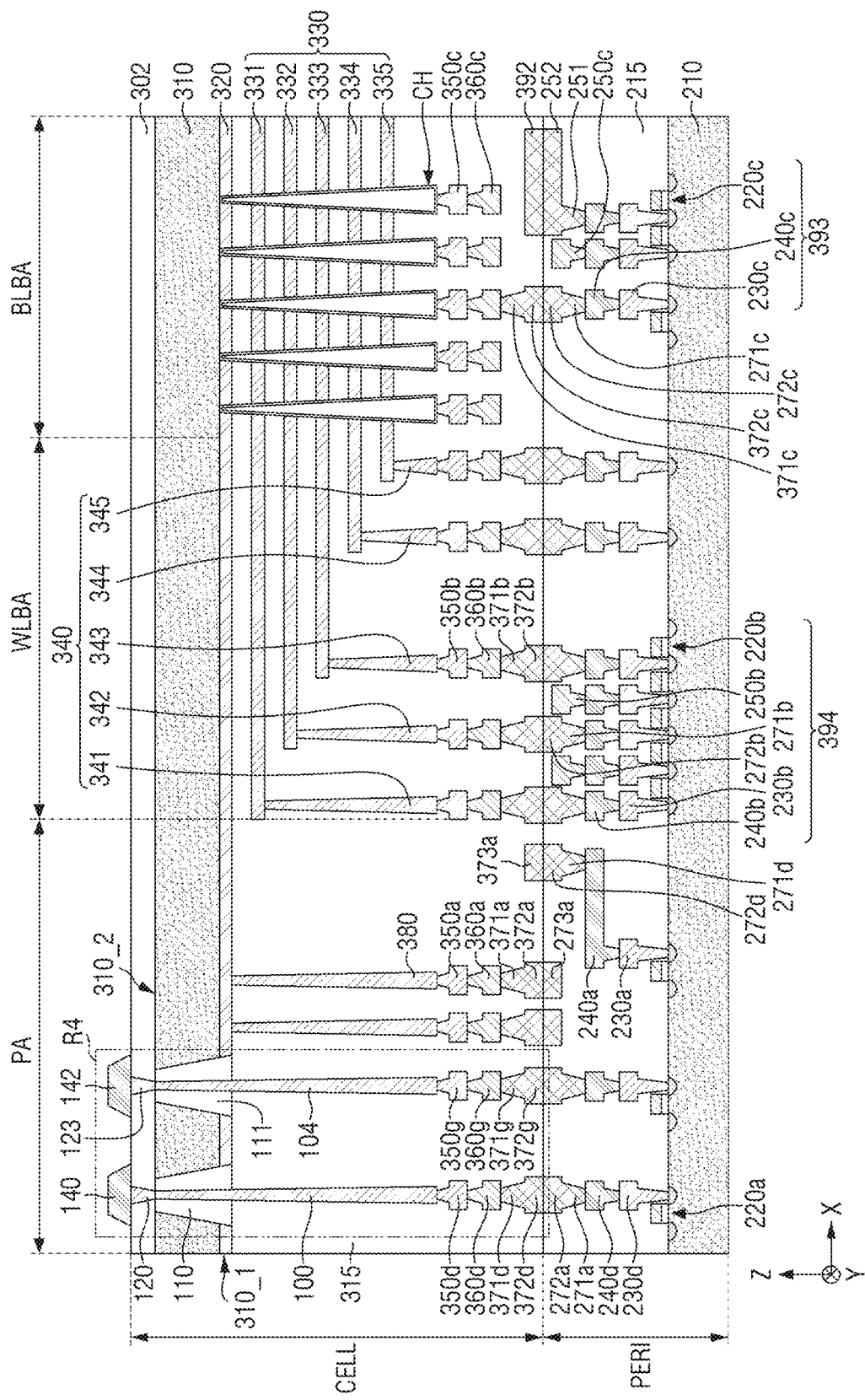
FIG. 14 is an example cross-sectional view of a nonvolatile memory device according to some example embodiments.

FIG. 14 is an example cross-sectional view of a nonvolatile memory device according to some example embodiments. FIG. 15 is an enlarged view of area R4 of FIG. 14. For simplicity of description, redundant parts of the description made with reference to FIGS. 1 to 9 will be recapitulated or omitted.

Figure 15:
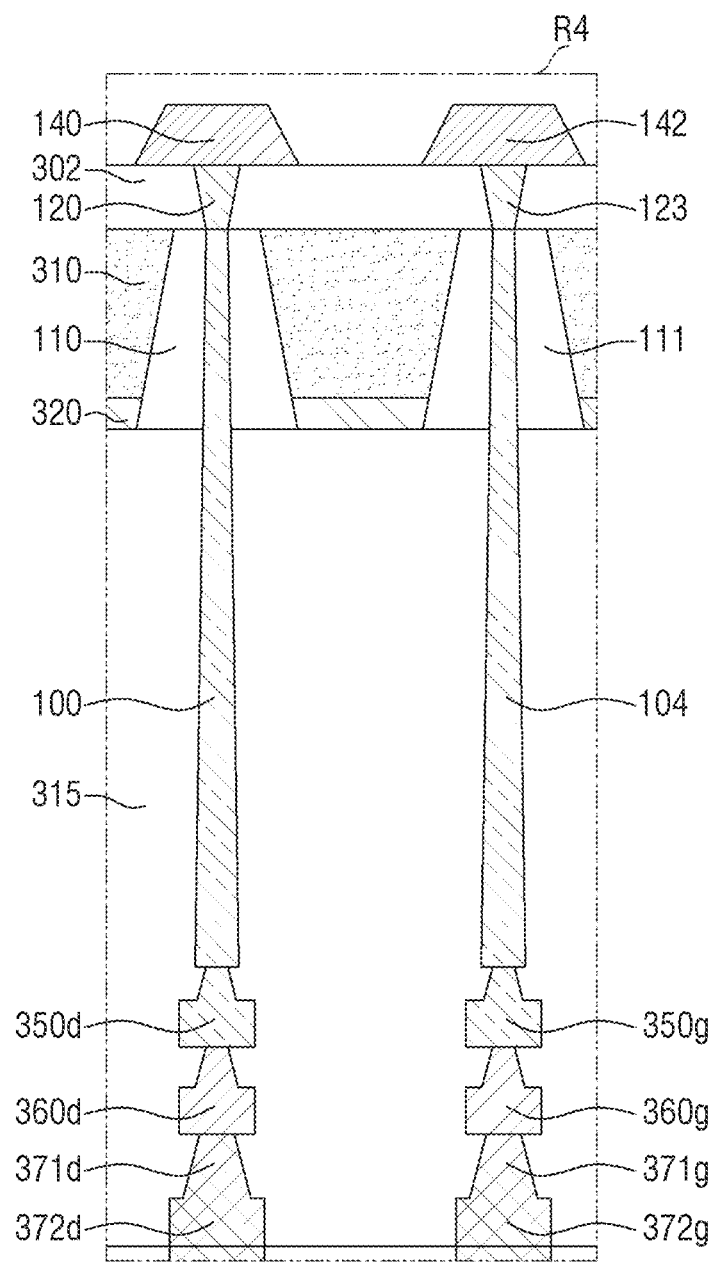
FIG. 15 is an enlarged view of area R4 of FIG. 14.

Referring to FIGS. 14 and 15, the nonvolatile memory device 1 may include an insulating pattern 111, a first contact plug 104, a second contact plug 123, an input/output pad 142, a first metal layer 350g, a second metal layer 360g, and upper bonding metals 371g and 372g.

The insulating pattern 111 may be formed in the second substrate 310. The insulating pattern 111 may be formed to penetrate the second substrate 310. The insulating pattern 111 may be spaced apart from the insulating pattern 110 in the first direction X.

The first contact plug 104 may be formed in the insulating pattern 111 and the interlayer insulating layer 315. That is, the first contact plug 104 may be formed to penetrate the insulating pattern 111 and the interlayer insulating layer 315. The first contact plug 104 may be surrounded by the insulating pattern 111.

The first contact plug 104 may be different from the first contact plug 100. For example, the first contact plug 104 may be connected to the first and second metal layers 350g and 360g, and the upper bonding metals 371g and 372g. The first contact plug 104 may be spaced apart from the first contact plug 100 in the first direction X.

The second contact plug 123 may be formed in the insulating layer 302. That is, the second contact plug 123 may be formed to penetrate the insulating layer 302. The second contact plug 123 may be formed in the insulating layer 302 together with the second contact plug 120. Both the second contact plugs 120 and 123 may be surrounded by the insulating layer 302.

The second contact plug 123 may be different from the second contact plug 120. For example, the second contact plug 123 may be connected to the first contact plug 104. The second contact plug 123 may be spaced apart from the second contact plug 120 in the first direction X.

The input/output pad 142 may be formed on the insulating layer 302. The input/output pad 142 may be connected to the second contact plug 123. The input/output pad 142 may be spaced apart from the input/output pad 140. The input/output pad 142 may transmit and receive a signal which is different from the signal transmitted and received by the input/output pad 140. Consequently, the nonvolatile memory device 1 may transmit and receive more data through the first and second contact plugs 104 and 123, and the input/output pad 142.

Hereinafter, a nonvolatile memory device 1 according to some other example embodiments will be described with reference to FIG. 16.

Figure 16:
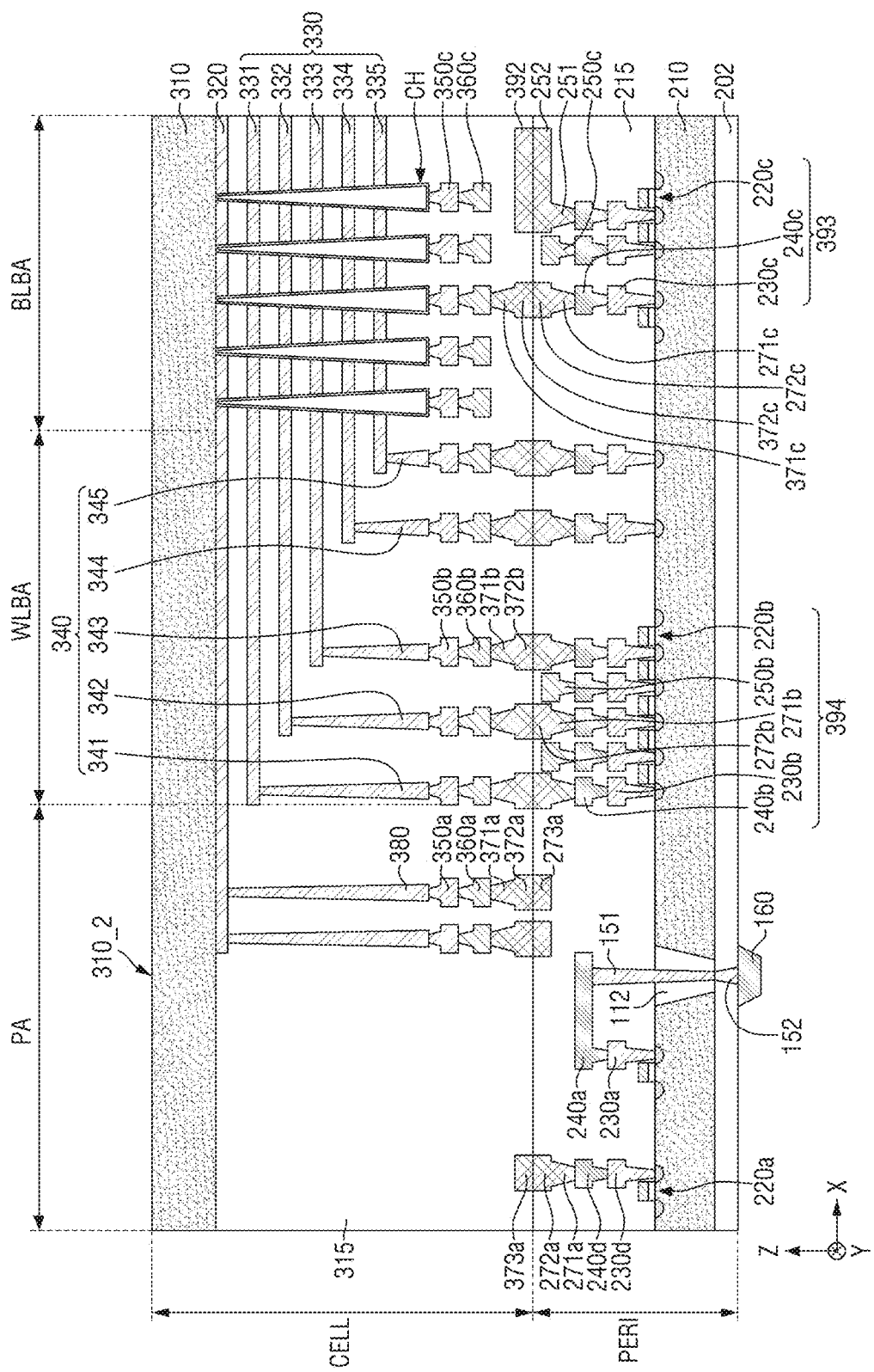
FIG. 16 is an example cross-sectional view of a nonvolatile memory device according to some example embodiments.

FIG. 16 is an example cross-sectional view of a nonvolatile memory device according to some example embodiments. For simplicity of description, redundant parts of the description made with reference to FIGS. 1 to 9 will be recapitulated or omitted.

Referring to FIG. 16, the nonvolatile memory device 1 may include an insulating pattern 112, an insulating layer 202, a first contact plug 151, a second contact plug 152, and an input/output pad 160. Further, the nonvolatile memory device 1 may include the bonding pad 373a.

Unlike the nonvolatile memory device 1 shown in FIG. 2, the nonvolatile memory device 1 shown in FIG. 16 may not include the insulating pattern 110, the insulating layer 302, the first and second contact plugs 100 and 120, and the input/output pad 140. That is, a route, through which a signal is transmitted/received between the peripheral circuit region PERI and the input/output pad 140 via the cell region CELL, may not exist. However, embodiments according to the technical spirit of the present disclosure are not limited thereto, and the nonvolatile memory device 1 may include the insulating pattern 110, the insulating layer 302, the first and second contact plugs 100 and 120, and the input/output pad 140 as well as the insulating pattern 112, the insulating layer 202, the first and second contact plugs 151 and 152, and the input/output pad 160.

Referring to FIG. 16, the insulating pattern 112 may be formed in the first substrate 210. The insulating pattern 112 may be surrounded by the first substrate 210. The top and bottom surfaces of the insulating pattern 112 may be respectively exposed at the top and bottom surfaces of the first substrate 210. When the circuit elements 220a, 220b, and 220c of the peripheral circuit region PERI are formed, the insulating pattern 112 may be formed together.

The first contact plug 151 may be formed in the interlayer insulating layer 215 and the insulating pattern 112. The first contact plug 151 may be formed to penetrate the interlayer insulating layer 215 and the insulating pattern 112. The bottom surface of the first contact plug 151 may be exposed at the bottom surface of the insulating pattern 112.

The insulating layer 202 may be formed on the first substrate 210. The insulating layer 202 may entirely cover the first substrate 210. The insulating layer 202 may cover the first contact plug 151.

The second contact plug 152 may be formed in the insulating layer 202. The second contact plug 152 may be formed to penetrate the insulating layer 202. The second contact plug 152 may be connected to the first contact plug 151.

The input/output pad 160 may be formed on the insulating layer 202. The input/output pad 160 may cover the second contact plug 152. The input/output pad 160 may be connected to the second contact plug 152. Accordingly, the input/output pad 160 may be electrically connected to the first and second contact plugs 151 and 152. The input/output pad 160 may be electrically connected to at least one of the circuit element 220a, 220b, or 220c through the second metal layer 240a and the first metal layer 230a. That is, the input/output pad 161 may receive signals from the circuit elements 220a, 220b, and 220c, and may also transmit signals to the circuit elements 220a, 220b, and 220c.

Hereinafter, a nonvolatile memory device 1 according to some other example embodiments will be described with reference to FIG. 17.

Figure 17:
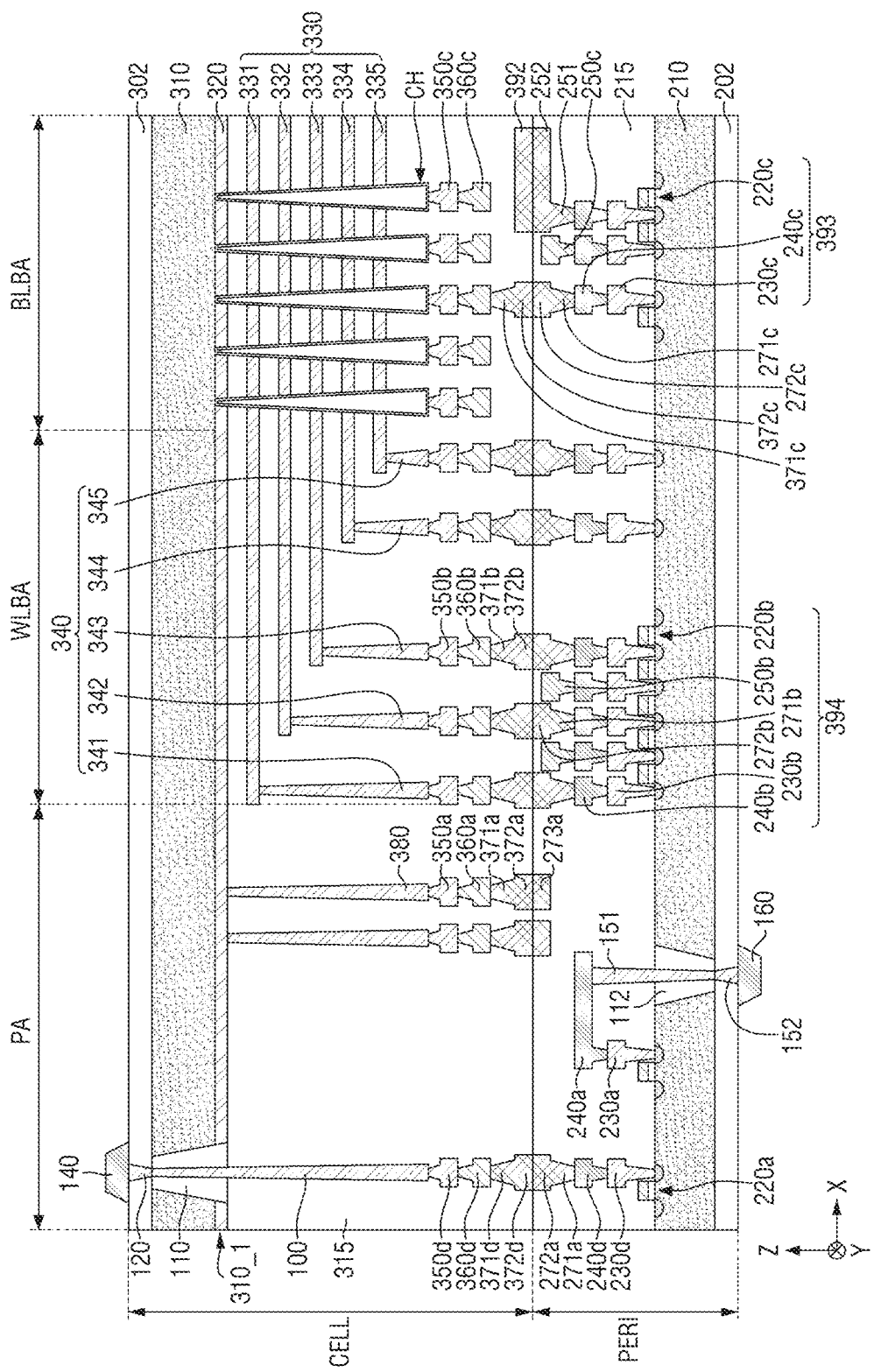
FIG. 17 is an example cross-sectional view of a nonvolatile memory device according to some example embodiments.

FIG. 17 is an example cross-sectional view of a nonvolatile memory device according to some example embodiments. For simplicity of description, redundant parts of the description made with reference to FIGS. 1 to 9 and 16 will be recapitulated or omitted.

Referring to FIG. 17, the nonvolatile memory device 1 may further include the insulating pattern 112, the insulating layer 202, the first and second contact plugs 151 and 152, and the input/output pad 160. That is, the nonvolatile memory device 1 may include the insulating pattern 112, the insulating layer 202, the first and second contact plugs 151 and 152, and the input/output pad 160 as well as the insulating pattern 110, the insulating layer 302, the first and second contact plugs 100 and 120, and the input/output pad 140.

The input/output pad 160 may be arranged on the bottom surface of the nonvolatile memory device 1, and the input/output pad 140 may be arranged on the top surface of the nonvolatile memory device 1. A signal transmitted from at least one of the circuit element 220a, 220b, or 220c may be transmitted through the first contact plug 100, the second contact plug 120, and the input/output pad 140. Further, a signal transmitted from at least one of the circuit element 220a, 220b, or 220c may be transmitted through the first contact plug 151, the second contact plug 152, and the input/output pad 160. That is, the circuit elements 220a, 220b, and 220c may transmit and receive data in two directions through the input/output pad 140 and the input/output pad 160.

Figure 18:
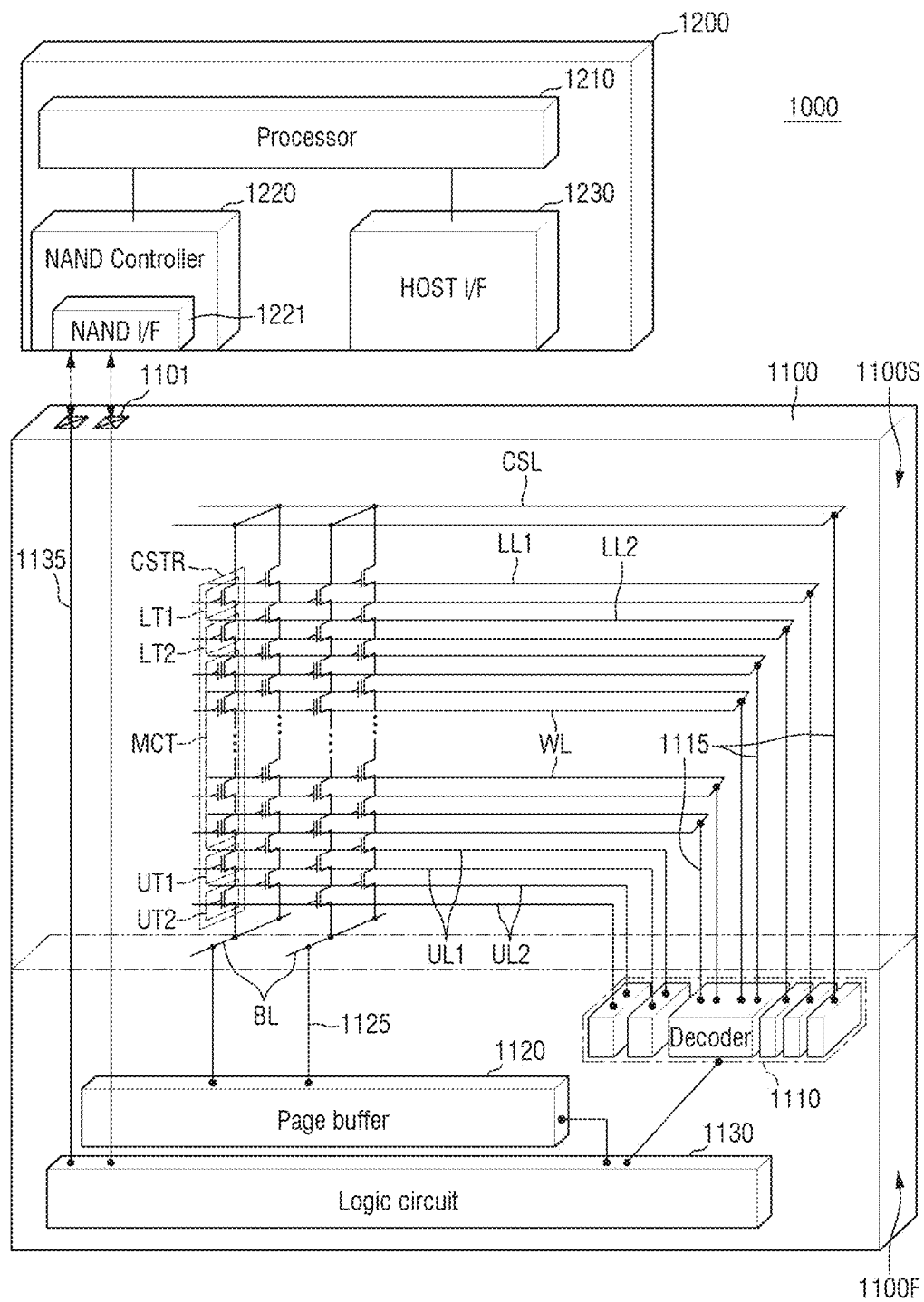
FIG. 18 is an example block diagram of a nonvolatile memory system including a nonvolatile memory device according to some example embodiments.

FIG. 18 is an example block diagram of a nonvolatile memory system including a nonvolatile memory device according to some example embodiments.

Referring to FIG. 18, a nonvolatile memory system 1000 according to some example embodiments may include a semiconductor device 1100 and a controller 1200 electrically connected to the semiconductor device 1100. The nonvolatile memory system 1000 may be a storage device including one or more semiconductor devices 1100 or an electronic system including a storage device. For example, the electronic system 1000 may be a solid-state drive (SSD), a universal serial bus (USB), a computing system, a medical device, or a communication device, which includes one or more semiconductor devices 1100.

The semiconductor device 1100 may be a nonvolatile memory device, for example, a NAND flash memory device described with reference to FIGS. 1 to 17. The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may vary according to example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 that are connected in series. The upper transistors UT1 and UT2 may include a string select transistor UT1 and an upper erase control transistor UT2 that are connected in series. At least one of the lower erase control transistor LT1 or the upper erase control transistor UT2 may be used for an erase operation in which data stored in the memory cell transistors MCT is deleted using a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F to the second structure 1100S. The bit lines BL may be electrically connected to the page buffer 1120 through second connection wirings 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 that is electrically connected to the logic circuit 1130. The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. According to example embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to a predetermined (or, alternatively, desired) firmware, and may access the semiconductor device 1100 by controlling the NAND controller 1220. The NAND controller 1220 may include a NAND interface 1221 that communicates with the semiconductor device 1100. A control command for controlling the semiconductor device 1100, data to be written to the memory cell transistors MCT of the semiconductor device 1100, data to be read from the memory cell transistors MCT of the semiconductor device 1100, and the like may be transmitted through the NAND interface 1221. The host interface 1230 may provide a communication function between the electronic system 1000 and an external host. When the control command is received from the external host through the host interface 1230, the processor 1210 may control the semiconductor device 1100 in response to the control command.

Figure 19:
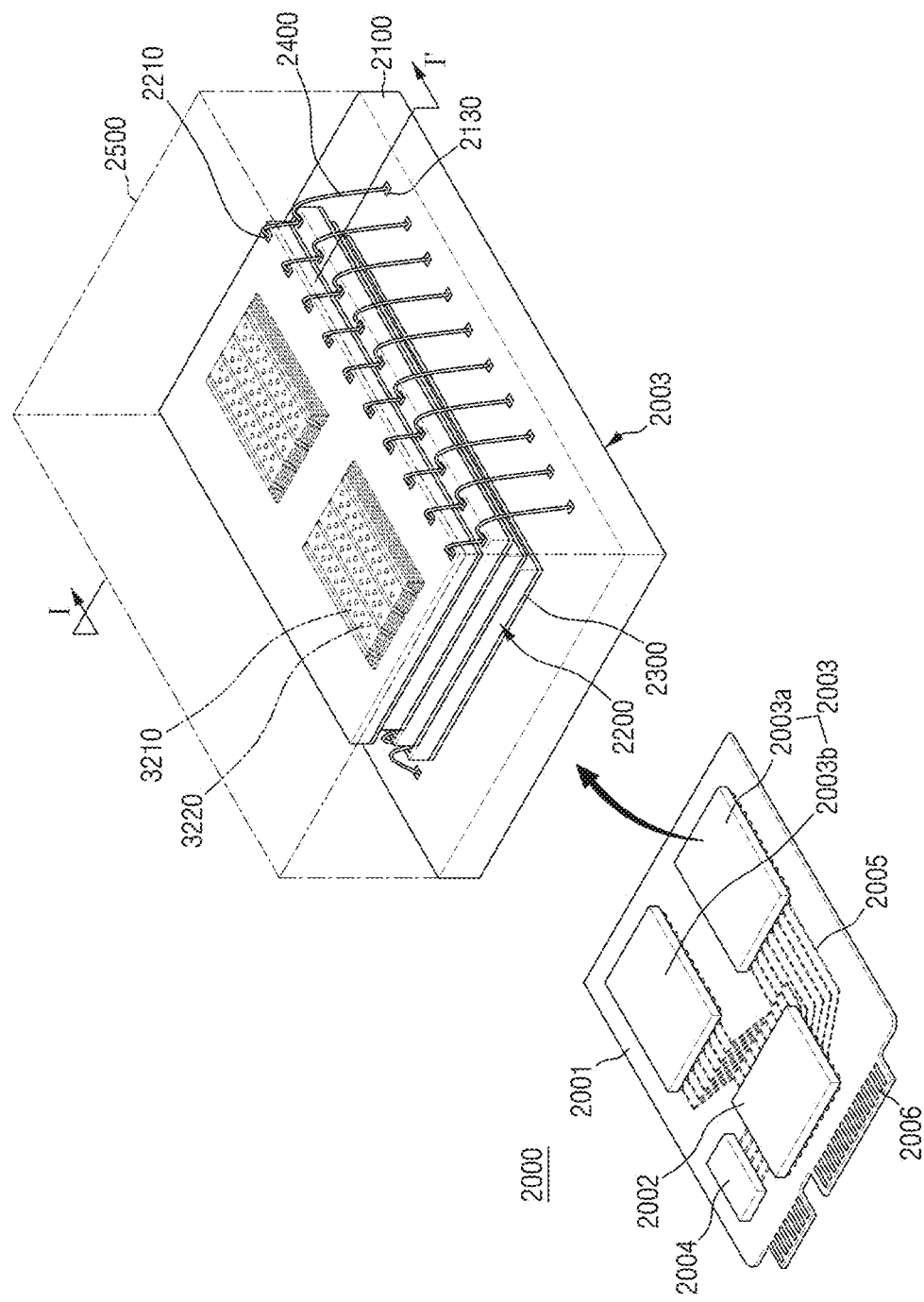
FIG. 19 is an example perspective view illustrating a nonvolatile memory system including a nonvolatile memory device according to some example embodiments.

FIG. 19 is an example perspective view illustrating a nonvolatile memory system including a nonvolatile memory device according to some example embodiments.

Referring to FIG. 19, a nonvolatile memory system 2000 according to some example embodiments may include a main substrate 2001, a controller 2002 mounted on the main substrate 2001, one or more nonvolatile memory packages 2003, and a dynamic random access memory (DRAM) 2004. The nonvolatile memory package 2003 and the DRAM 2004 may be connected to the controller 2002 by wiring patterns 2005 formed on the main substrate 2001.

The main substrate 2001 may include a connector 2006 having a plurality of pins connected to the external host. In the connector 2006, the number and arrangement of the pins may vary depending on a communication interface between the electronic system 2000 and the external host. In some example embodiments, the electronic system 2000 may communicate with the external host through any one of interfaces such as universal serial bus (USB), peripheral component interconnect express (PCIe), serial advanced technology attachment (SATA), and M-PHY for universal flash storage (UFS). In some example embodiments, the electronic system 2000 may be operated by a power supplied from the external host through the connector 2006. The electronic system 2000 may further include a power management integrated circuit (PMIC) that distributes the power supplied from the external host to the controller 2002 and the nonvolatile memory packages 2003.

The controller 2002 may write or read data to/from the nonvolatile memory package 2003, and may improve the operation speed of the electronic system 2000.

The DRAM 2004 may be a buffer memory for reducing a speed difference between the external host and the nonvolatile memory package 2003 as a data storage space. The DRAM 2004 included in the electronic system 2000 may also operate as a sort of cache memory, and may also provide a space for temporarily storing data in controlling the nonvolatile memory package 2003. When the electronic system 2000 includes the DRAM 2004, the controller 2002 may include not only a NAND controller for controlling the nonvolatile memory package 2003 but also a DRAM controller for controlling the DRAM 2004.

The nonvolatile memory packages 2003 may include first and second nonvolatile memory packages 2003a and 2003b spaced apart from each other. Each of the first and second nonvolatile memory packages 2003a and 2003b may be a nonvolatile memory package including a plurality of semiconductor chips 2200. Each of the first and second nonvolatile memory packages 2003a and 2003b may include a package substrate 2100, the semiconductor chips 2200 on the package substrate 2100, adhesive layers 2300 respectively disposed on the bottom surfaces of the semiconductor chips 2200, connection structures 2400 electrically connecting the semiconductor chips 2200 to the package substrate 2100, and a molding layer 2500 covering the semiconductor chips 2200 and the connection structures 2400 above the package substrate 2100.

Figure 20:
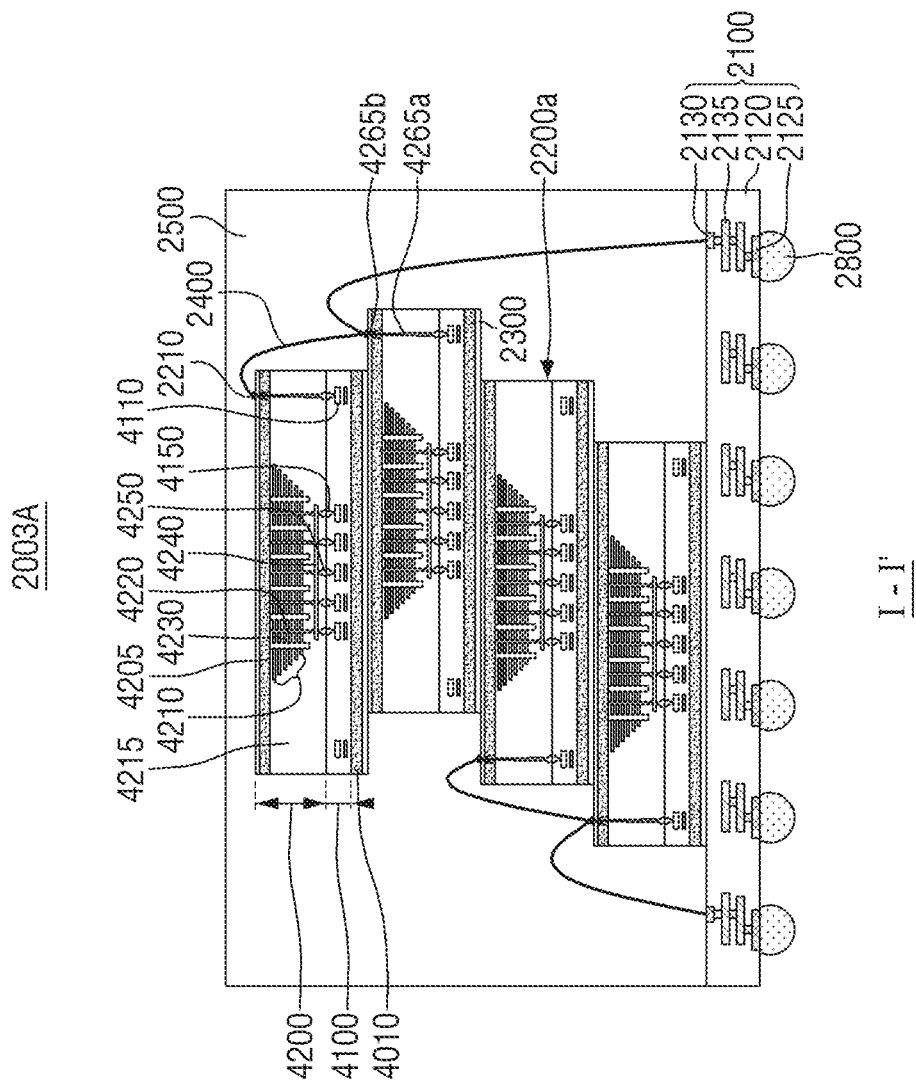
FIGS. 20 and 21 are example cross-sectional views of the nonvolatile memory package of FIG. 19, which includes a nonvolatile memory device according to some example embodiments, taken along line I-I'.

The package substrate 2100 may be a printed circuit board including upper package pads 2130. Referring to FIG. 20, the package substrate 2100 may include a package substrate body portion 2120, the upper package pads 2130 disposed on the top surface of the package substrate body portion 2120, lower pads 2125 arranged on the bottom surface of the package substrate body portion 2120 or exposed through the bottom surface thereof, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2001 of the electronic system 2000 through conductive connectors 2800, as shown in FIG. 19.

Each of the semiconductor chips 2200 may include an input/output pad 2210. The input/output pad 2210 may correspond to the input/output pad 1101 of FIG. 18. Each of the semiconductor chips 2200 may include word lines 3210 and channel structures 3220. Each of the semiconductor chips 2200 may include the nonvolatile memory device 1 described above with reference to FIGS. 1 to 17.

In example embodiments, the connection structure 2400 may be a bonding wire that electrically connects the input/output pad 2210 to the upper package pad 2130. Accordingly, in each of the first and second nonvolatile memory packages 2003a and 2003b, the semiconductor chips 2200 may be electrically connected to each other, and may be electrically connected to the upper package pads 2130 of the package substrate 2100, by a wire bonding method. According to other example embodiments, in each of the first and second nonvolatile memory packages 2003a and 2003b, the semiconductor chips 2200 may be electrically connected to each other by a connection structure including a through silicon via (TSV) instead of the connection structure 2400 using the wire bonding method.

In example embodiments, the controller 2002 and the semiconductor chips 2200 may be included in one package. In an example embodiment, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 21:
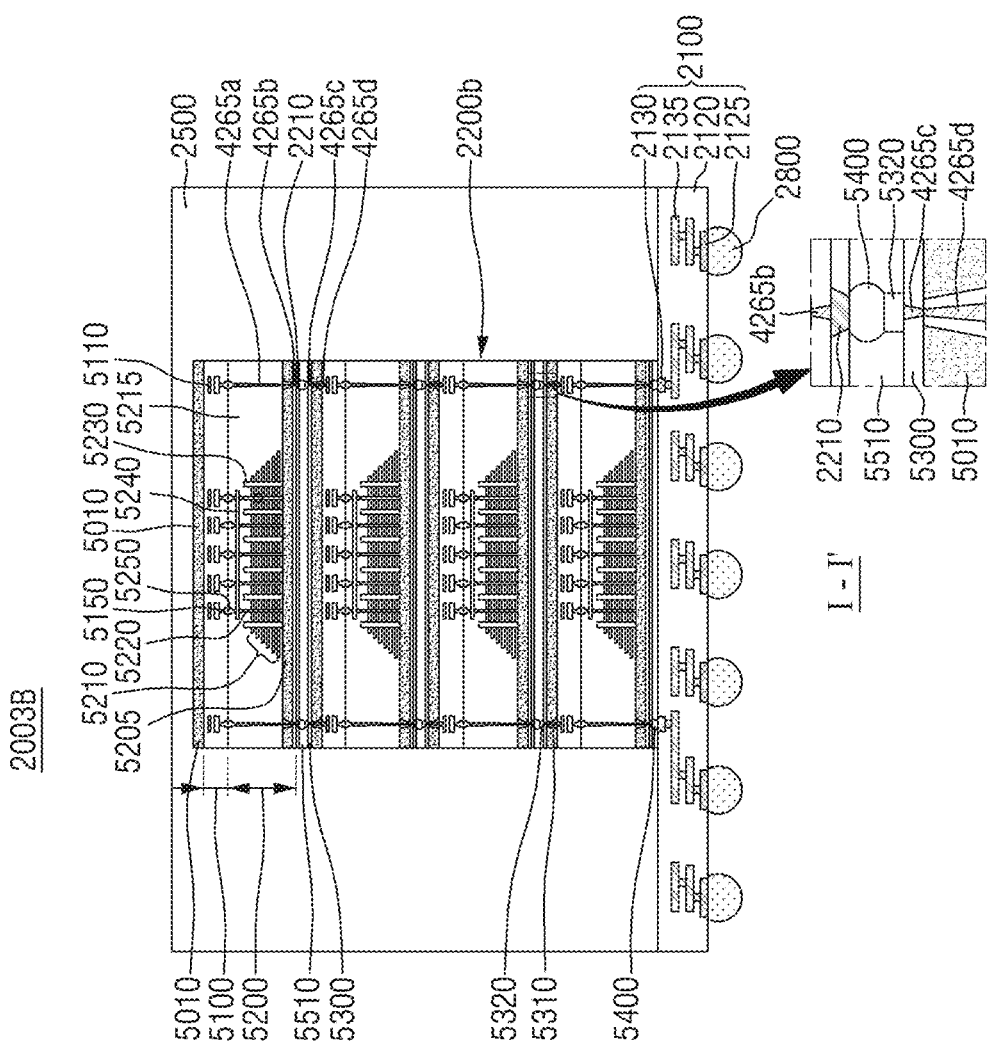

FIGS. 20 and 21 are example cross-sectional views of the nonvolatile memory package of FIG. 19, which includes a nonvolatile memory device according to some example embodiments, taken along line I-I'.

Referring to FIG. 20, in a nonvolatile memory package 2003A, each of semiconductor chips 2200a may include a semiconductor substrate 4010, a first structure 4100 on the semiconductor substrate 4010, and a second structure 4200 bonded to the first structure 4100 by a wafer bonding method on the first structure 4100.

The first structure 4100 may include a peripheral circuit region having a peripheral wiring 4110 and first bonding structures 4150.

The second structure 4200 may include an insulating layer 4215, a substrate 4205 having a common source line, word lines 4210 between the substrate 4205 and the first structure 4100, channel structures 4220 and separation structures 4230 that penetrate the word lines 4210, and second bonding structures 4250 electrically connected to each of the channel structures 4220 and the word lines 4210 ('WL' of FIG. 18).

For example, the second bonding structures 4250 may be electrically connected to each of the channel structures 4220 and the word lines ('WL' of FIG. 18) through bit lines 4240 electrically connected to the channel structures 4220 and gate connection wirings ('1115' of FIG. 18) electrically connected to the word lines ('WL' of FIG. 18). The first bonding structures 4150 of the first structure 4100 may be bonded to the second bonding structures 4250 of the second structure 4200 while being in contact therewith, respectively. Bonded parts of the first bonding structures 4150 and the second bonding structures 4250 may be formed of, for example, copper (Cu).

The semiconductor chips 2200*a* including a nonvolatile memory device according to some example embodiments may include a first contact plug 4265*a* and a second contact plug 4265*b*. The first contact plug 4265*a* may be electrically connected to some of the first bonding structures 4150. A signal transmitted from the peripheral wiring 4110 may be outputted to the input/output pad 2210 through the first contact plug 4265*a* and the second contact plug 4265*b*. Here, the first contact plug 4265*a* may correspond to the first contact plug 100 of the nonvolatile memory device 1 described with reference to FIGS. 1 to 15. Further, the second contact plug 4265*b* may correspond to the second contact plug 120 of the nonvolatile memory device 1 described with reference to FIGS. 1 to 15.

The semiconductor chips 2200*a* of FIG. 20 may be electrically connected to each other by the bonding wire type connection structures 2400. However, in example embodiments, semiconductor chips in one nonvolatile memory package such as the semiconductor chips 2200*a* of FIG. 20 may be electrically connected to each other by a connection structure including a through silicon via (TSV).

Referring to FIG. 21, in a semiconductor package 2003B, semiconductor chips 2200*b* may be vertically aligned. Each of the semiconductor chips 2200*b* may include a semiconductor substrate 5010, a first structure 5100 formed under the semiconductor substrate 5010, and a second structure 5200 bonded to the first structure 5100 by the wafer bonding method under the first structure 5100.

The first structure 5100 may include a peripheral circuit region having a peripheral wiring 5110, first bonding structures 5150, a third contact plug 4265*c* and a fourth contact plug 4265*d*.

The second structure 5200 may include the insulating layer 5215, the substrate 5205 including a common source line, word lines 5210 between the substrate 5205 and the first structure 5100, channel structures 5220 and separation structures 5230 that penetrate the word lines 5210, and second bonding structures 5250 electrically connected to each of the channel structures 5220 and the word lines 5210 ('WL' of FIG. 18).

For example, the second bonding structures 5250 may be electrically connected to each of the channel structures 5220 and the word lines ('WL' of FIG. 18) through bit lines 5240 electrically connected to the channel structures 5220 and gate connection wirings ('1115' of FIG. 18) electrically connected to the word lines ('WL' of FIG. 18). The first bonding structures 5150 of the first structure 5100 may be bonded to the second bonding structures 5250 of the second structure 5200 while being in contact therewith, respectively. Bonded parts of the first bonding structures 5150 and the second bonding structures 5250 may be formed of, for example, copper (Cu).

Among the semiconductor chips 2200*b*, the remaining semiconductor chips except for the uppermost semiconductor chip may include a backside insulating layer 5300 on the semiconductor substrate 5010, a backside input/output pad 5320 on the backside insulating layer 5300, and a connection structure 5400 connected to the backside input/output pad 5320. The connection structures 5400 may electrically connect the semiconductor chips 2200*b* to each other and may electrically connect the semiconductor chips 2200*b* to the package substrate 2100. An underfill material layer 5510 may surround the side surface of the connection structure 5400.

The semiconductor chips 2200*b* including a nonvolatile memory device according to some example embodiments may include the first contact plug 4265*a*, the second contact plug 4265*b*, a third contact plug 4265*c*, and a fourth contact plug 4265*d*. The first and second contact plugs 4265*a* and 4265*b* may be connected to the input/output pad 2210. The third and fourth contact plugs 4265*c* and 4265*d* may be connected to the backside input/output pad 5320. The backside input/output pad 5320 may be electrically connected to the input/output pad 2210 by the connection structure 5400.

Here, the first contact plug 4265*a* may correspond to the first contact plug 100 of the nonvolatile memory device 1 described with reference to FIGS. 1 to 15 and 17. The second contact plug 4265*b* may correspond to the second contact plug 120 of the nonvolatile memory device 1 described with reference to FIGS. 1 to 15 and 17. The third contact plug 4265*c* may correspond to the second contact plug 152 described with reference to FIG. 17. The fourth contact plug 4265*d* may correspond to the first contact plug 151 described with reference to FIG. 17.

In concluding the detailed description, those skilled in the art will appreciate that many variations and modifications can be made to the example embodiments without substantially departing from the principles of the present disclosure. Therefore, the disclosed example embodiments are used in a generic and descriptive sense only and not for purposes of limitation.

What is claimed is:

1. A nonvolatile memory device comprising:
   a substrate including a first surface and a second surface opposite to the first surface in a first direction;
   a common source line on the first surface of the substrate;
   a plurality of word lines stacked on the common source line;
   a first insulating pattern spaced apart from the plurality of word lines in a second direction crossing the first direction, and in the substrate;
   an insulating layer on the second surface of the substrate;
   a first contact plug penetrating the first insulating pattern and extending in the first direction;
   a second contact plug penetrating the insulating layer, extending in the first direction, and connected to the first contact plug;
   an upper bonding metal connected to the first contact plug and connected to a circuit element; and
   a first input/output pad connected to the second contact plug and electrically connected to the circuit element.

2. The nonvolatile memory device of claim 1, wherein a sidewall of the first insulating pattern is surrounded by the substrate, and the first insulating pattern is exposed on the first surface of the substrate and the second surface of the substrate.

3. The nonvolatile memory device of claim 2, wherein the first contact plug is in contact with the second contact plug on the second surface.

4. The nonvolatile memory device of claim 1, wherein a width of the first insulating pattern in the second direction is greater than a width of the first contact plug in the second direction.

5. The nonvolatile memory device of claim 4, wherein a width of the first insulating pattern in the second direction is greater than a width of the second contact plug in the second direction.

6. The nonvolatile memory device of claim 1, wherein a length of the first insulating pattern in the first direction is smaller than a length of the first contact plug in the first direction.

7. The nonvolatile memory device of claim 1, further comprising:
a third contact plug penetrating the first insulating pattern, extending in the first direction, and spaced apart from the first contact plug in the second direction;
a fourth contact plug penetrating the insulating layer, extending in the first direction, spaced apart from the second contact plug in the second direction, and connected to the third contact plug; and
a second input/output pad connected to the fourth contact plug and electrically connected to the circuit element.

8. The nonvolatile memory device of claim 7, wherein the first and third contact plugs are in the first insulating pattern, and
the second and fourth contact plugs are in the insulating layer.

9. The nonvolatile memory device of claim 1, further comprising a dummy contact plug penetrating the first insulating pattern, extending in the first direction, and spaced apart from the first contact plug in the second direction.

10. The nonvolatile memory device of claim 9, wherein the dummy contact plug is not in contact with the second contact plug.

11. The nonvolatile memory device of claim 1, further comprising:
a second insulating pattern in the substrate and spaced apart from the first insulating pattern;
a third contact plug penetrating the second insulating pattern and extending in the first direction;
a fourth contact plug penetrating the insulating layer, extending in the first direction, and connected to the third contact plug; and
a second input/output pad connected to the fourth contact plug and electrically connected to the circuit element.

12. A nonvolatile memory device comprising:
a peripheral circuit region including a plurality of circuit elements and including a lower bonding metal connected to the plurality of circuit elements; and
a cell region electrically connected to the plurality of circuit elements and including a memory element for storing data, and including an upper bonding metal connected to the memory element,
wherein the peripheral circuit region includes:
a substrate including a first surface and a second surface opposite to the first surface in a first direction;
the plurality of circuit elements on the first surface of the first substrate;
a metal layer on the first surface of the first substrate and connected to a part of the plurality of circuit elements;
a first insulating pattern in the first substrate;
a first insulating layer on the second surface of the first substrate;
a first contact plug penetrating the first insulating pattern, extending from the metal layer in the first direction, and connected to the metal layer;
a second contact plug penetrating the first insulating layer, extending in the first direction, and connected to the first contact plug; and
a first input/output pad on the first insulating layer and connected to the second contact plug.

13. The nonvolatile memory device of claim 12, wherein the upper bonding metal and the lower bonding metal are bonded on a contact surface between the cell region and the peripheral circuit region.

14. The nonvolatile memory device of claim 12, wherein the cell region includes:
a second substrate including a third surface and a fourth surface opposite to the third surface in the first direction;
a common source line on the third surface of the second substrate;
a plurality of word lines stacked on the common source line;
a second insulating pattern in the second substrate;
a second insulating layer on the fourth surface of the second substrate;
a third contact plug penetrating the second insulating pattern and extending in the first direction;
a fourth contact plug penetrating the second insulating layer, extending in the first direction, and connected to the third contact plug;
a bonding metal connected to the third contact plug and connected to at least a part of the plurality of circuit elements; and
a second input/output pad connected to the fourth contact plug and electrically connected to at least a part of the plurality of circuit elements.

15. The nonvolatile memory device of claim 14, wherein the lower bonding metal of the peripheral circuit region is in contact with the bonding metal of the cell region.

16. The nonvolatile memory device of claim 14, wherein the second insulating pattern is spaced apart from the plurality of word lines.

17. The nonvolatile memory device of claim 14, wherein the bonding metal of the cell region is electrically connected to the plurality of circuit elements of the peripheral circuit region through the metal layer of the peripheral circuit region.

18. A nonvolatile memory system comprising:
a main substrate;
a nonvolatile memory device on the main substrate; and
a controller on the main substrate and electrically connected to the nonvolatile memory device,
wherein the nonvolatile memory device includes:
a first substrate including a first surface and a second surface opposite to the first surface in a first direction;
a second substrate spaced apart from the first substrate in the first direction;
a cell structure formed between the first and second substrates;

a peripheral circuit structure including a circuit element configured to drive the cell structure and is between the first and second substrates;

an insulating pattern in the first substrate;

an insulating layer on the second surface of the first substrate;

a first contact plug penetrating the insulating pattern and extending in the first direction;

a second contact plug penetrating the insulating layer, extending in the first direction, and connected to the first contact plug;

a circuit wiring connected to the first contact plug and connected to the circuit element; and an input/output pad connected to the second contact plug and electrically connected to the circuit element.

19. The nonvolatile memory system of claim 18, wherein the cell structure is connected to the first substrate, and the peripheral circuit structure is connected to the second substrate.

20. The nonvolatile memory system of claim 18, wherein the peripheral circuit structure is connected to the first substrate, and the cell structure is connected to the second substrate.

* * * * *